US012660564B2

(12) United States Patent
Bower et al.

(10) Patent No.: US 12,660,564 B2
(45) Date of Patent: Jun. 16, 2026

(54) PRINT-READY WAFERS WITH BOTTOM-ANCHORED COMPONENTS

(71) Applicant: Daktronics, Inc., Brookings, SD (US)

(72) Inventors: Christopher Andrew Bower, Raleigh, NC (US); Matthew Alexander Meitl, Durham, NC (US); Nikhil Jain, Raleigh, NC (US); Ronald S. Cok, Rochester, NY (US)

(73) Assignee: Daktronics, Inc., Brookings, SD (US)

( * ) Notice: Subject to any disclaimer, the term of this patent is extended or adjusted under 35 U.S.C. 154(b) by 655 days.

(21) Appl. No.: 17/898,398

(22) Filed: Aug. 29, 2022

(65) Prior Publication Data

US 2024/0071801 A1     Feb. 29, 2024

(51) Int. Cl.
H10P 72/70          (2026.01)
H10W 72/20          (2026.01)

(52) U.S. Cl.
CPC ........... H10P 72/74 (2026.01); H10W 72/252 (2026.01)

(58) Field of Classification Search
CPC ................................................. H01L 21/6835
See application file for complete search history.

(56) References Cited

U.S. PATENT DOCUMENTS 8,722,458 B2     5/2014  Rogers et al.
8,835,940 B2     9/2014  Hu et al.

8,889,485 B2     11/2014  Bower
9,929,053 B2 *    3/2018  Bower .................. H01L 21/561
10,008,465 B2     6/2018  Bower
10,224,231 B2 *   3/2019  Bower ................ H01L 21/6835
10,468,363 B2 *  11/2019  Prevatte ................. H01L 24/98
10,930,623 B2 *   2/2021  Cok ..................... H01L 25/0753
11,276,657 B2     3/2022  Prevatte et al.
2018/0138071 A1 *  5/2018  Bower ............... H01L 21/6835
2018/0286734 A1 * 10/2018  Meitl .................. H01L 21/6835

OTHER PUBLICATIONS

Hamer et al., 63.2: AMOLED Displays Using Transfer-Printed Integrated Circuits, SID 09 DIGEST, 40(2):947-950 (2009).

* cited by examiner

*Primary Examiner* — William A Harriston

(74) *Attorney, Agent, or Firm* — Schwegman Lundberg & Woessner, P.A.

(57)          ABSTRACT

A printable-component structure includes a carrier substrate, a bonding layer disposed on the carrier substrate, a solid weak-adhesion layer disposed on at least a portion of the bonding layer, at least a portion of a component disposed directly on and in contact with at least a portion of the weak-adhesion layer, and a release layer disposed in contact with at least a portion of the component. The component is adhered to the weak-adhesion layer with a force that is less than the adhesion between the component and a stamp, such as a PDMS stamp. The component can include a protruding post in sole contact with the weak-adhesion layer.

22 Claims, 23 Drawing Sheets

PRINT-READY WAFERS WITH BOTTOM-ANCHORED COMPONENTS

FIELD OF THE DISCLOSURE

The present disclosure relates to structures and methods for micro transfer printing micro-devices from a source wafer.

BACKGROUND OF THE DISCLOSURE

Micro-devices can be micro-assembled on a target substrate by constructing the micro-devices over a release layer on a native source substrate, releasing the micro-devices from the native source substrate by etching the release layer, contacting the micro-devices with stamp posts of a stamp to adhere the micro-devices to the stamp posts, removing the micro-devices from the native source wafer with the stamp, transporting the stamp and micro-devices to the target substrate, and contacting the micro-devices to the target substrate. The stamp is then removed, leaving the micro-devices adhered to the target substrate. This process is disclosed, for example, in U.S. Pat. Nos. 10,468,363 and 10,930,623.

The article *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947 describes this process in more detail. Small integrated circuits are formed over a buried oxide layer on the process side of a native crystalline source wafer. The small integrated circuits, or chiplets, are released from the source wafer by etching the buried oxide layer leaving the micro-devices physically connected to an anchor portion of the native source wafer with a lateral tether. A visco-elastic elastomeric PDMS stamp is pressed against the wafer and the process side of the chiplets is adhered to the stamp. The stamp is relatively quickly pulled away from the source wafer with the adhered chiplets and moved to a target substrate coated with an adhesive. The chiplets are pressed against a target substrate or backplane with the stamp and adhered to the target substrate. The stamp is relatively slowly removed from the chiplets and target substrate. The adhesive is subsequently cured, permanently bonding the chiplets to the target substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

U.S. Pat. No. 8,835,940 discloses a micro-device stabilization post disposed between a micro-device and a carrier substrate (carrier wafer). The micro-device is formed on a growth substrate (native source wafer), a thin bonding layer with a low melting temperature such as a solder or other low-melting temperature metal such as indium is coated on a portion of the micro-device, and a patterned sacrificial (release) layer is disposed over the bonding layer and micro-device that defines a post in contact with the bonding layer. The sacrificial layer is adhered to a carrier substrate with a stabilization layer. The growth substrate is removed, and the sacrificial layer is etched away, leaving the micro-device attached to the carrier substrate with the post by the bonding layer. The bonding layer is melted, reducing the adhesion of the micro-device to the post, and the micro-device is picked up by a transfer head (an electro-static stamp) and removed from the carrier substrate.

Once transfer-printed, micro-devices on the target substrate must be electrically connected, for example to power and ground and signal wires. Such connections can be made using photolithographic methods and materials, for example using thin-film interconnects, or by using interconnect-at-print structures, as described in U.S. Pat. Nos. 10,008,465, 10,468,363, and 11,276,657 that each teach electrically conductive posts that, when printed, can electrically connect with contact pads on a target substrate.

There is a continuing need for micro-assembling micro-devices from a native source wafer onto a target substrate and electrically connecting the micro-devices on the target substrate in a way that is efficient, robust, and low cost.

SUMMARY OF THE DISCLOSURE

In accordance with embodiments of the present disclosure, inter alia, a printable-component structure comprises a carrier substrate, a bonding layer disposed on the carrier substrate, a solid weak-adhesion layer disposed on (e.g., at least a portion of) the bonding layer, a component disposed directly on and in contact with (e.g., at least a portion of the component being disposed directly on and in contact with) the weak-adhesion layer (e.g., directly on and in contact with at least a portion of the weak-adhesion layer), and a release layer disposed in contact with the component (e.g., at least a portion thereof). In some embodiments, the release layer (e.g., at least a portion thereof) can be in contact with the bonding layer (e.g., at least a portion thereof). In some embodiments, the release layer (e.g., at least a portion thereof) can be in contact with the weak-adhesion layer (e.g., at least a portion thereof). In some embodiments, the release layer (e.g., at least a portion thereof) is disposed between the component and the bonding layer. In some embodiments, the release layer (e.g., at least a portion thereof) is disposed between the component and the weak-adhesion layer.

According to embodiments of the present disclosure, the component comprises one or more posts protruding from the component and into contact with the weak-adhesion layer. The post(s) can extend through at least a portion of the release layer to the weak-adhesion layer. Each post can have a distal end and a proximal end, and the distal end can have a smaller area than the proximal end. Each post can have a sharp point and can be coated with gold or comprises gold. In some embodiments, no portion of the component other than the one or more posts is disposed directly on and in contact with the weak-adhesion layer.

Some embodiments comprise a component circuit or at least a portion of a component circuit disposed in the component and the posts can be electrically conductive posts electrically connected to the component circuit, for example through electrical vias. According to embodiments of the present disclosure, a side of the component in contact with the weak-adhesion layer comprises a noble metal such as gold (e.g., is coated with gold). The weak-adhesion layer can comprise a dielectric such as an oxide, nitride, a metal oxide, a polymer, silicon dioxide, or silicon nitride. In some embodiments, the component contacts the weak-adhesion layer only by contact between a noble metal and a dielectric.

According to embodiments of the present disclosure, methods of printing a printable component comprise providing a printable-component structure and providing a target substrate, adhering the component to a provided stamp, removing the component from the carrier substrate with the stamp, and contacting the component to the target substrate or to a layer disposed on the target substrate with the stamp.

Methods of the present disclosure comprise etching the release layer so that the component is physically connected to the carrier substrate with the weak-adhesion layer and the bonding layer, the component is in contact with only the weak-adhesion layer, and the release layer is a gap.

Methods of making a printable-component can comprise providing a growth substrate, constructing a component on the growth substrate, the component comprising one or more posts protruding from the component, coating at least some portion of the component and the growth substrate with a release layer, the one or more posts protruding through the release layer, and coating at least some portion of the release layer and the one or more posts with a weak-adhesion layer. Methods can comprise coating a side of the component with gold before coating the weak-adhesion layer. Methods can comprise providing a carrier substrate, coating the weak-adhesion layer with a bonding layer, and bonding the carrier substrate to the bonding layer. Methods can comprise removing the growth substrate to expose at least some portions the release layer and, optionally, some portions of the component. Methods can comprise etching the release layer so that the component is physically connected to the carrier substrate with the weak-adhesion layer and the bonding layer and the component is in direct and physical contact only with the weak-adhesion layer. In some embodiments, the component is exposed when the growth substrate is removed. In some embodiments, the component is exposed when the release layer is removed.

In some embodiments of the present disclosure, printable-component structure comprises a carrier substrate a solid bonding-and-weak-adhesion layer disposed on at least a portion of the carrier substrate, at least a portion of a component disposed directly on and in contact with at least a portion of the bonding-and-weak-adhesion layer, a stamp in contact with at least a portion of the component, and a release layer disposed in contact with at least a portion of the component. The component can adhere more strongly to the stamp than to the solid bonding-and-weak-adhesion layer. The solid bonding-and-weak-adhesion layer can adhere more strongly to the carrier substrate than to the component. The component can comprise one or more posts that penetrate or are embedded in the solid bonding-and-weak-adhesion layer.

In some embodiments, a printable-component structure comprises a carrier substrate, a solid bonding-and-weak-adhesion layer disposed on (e.g., at least a portion of) the carrier substrate, at least a portion of a component disposed directly on and in contact with at least a portion of the solid bonding-and-weak-adhesion layer, and a release layer disposed in contact with at least a portion of the component. The component comprises one or more posts that penetrate or are at least partially embedded in the solid bonding-and-weak-adhesion layer. In some embodiments, only the one or more posts of the component penetrate or are at least partially embedded in the solid bonding-and-weak-adhesion layer so that no other portion of the component is in contact with the solid bonding-and-weak-adhesion layer. In some embodiments, the release layer is disposed at least partially between a portion of the component and a portion of the solid bonding-and-weak-adhesion layer.

According to embodiments of the present disclosure, a printable-component structure comprises a carrier substrate, a solid bonding-and-weak-adhesion layer disposed on the carrier substrate, a component disposed directly on and in contact with the bonding-and-weak-adhesion layer, a stamp in contact with the component, and a release layer disposed in contact with the component. The component can be adhered more strongly to the stamp than to the solid bonding-and-weak-adhesion layer. The solid bonding-and-weak-adhesion layer can be adhered more strongly to the carrier substrate than to the component.

In some embodiments, the component comprises one or more posts that penetrate or are at least partially embedded in the solid bonding-and-weak-adhesion layer.

According to embodiments of the present disclosure, a printable-component structure comprises a carrier substrate, a solid bonding-and-weak-adhesion layer disposed on the carrier substrate, a component disposed directly on and in contact with the solid bonding-and-weak-adhesion layer, and a release layer disposed in contact with the component. In some embodiments, the component comprises one or more posts that penetrate or are at least partially embedded in the solid bonding-and-weak-adhesion layer. In some embodiments, only the one or more posts of the component penetrate or are at least partially embedded in the solid bonding-and-weak-adhesion layer. In some embodiments, the release layer is disposed between a portion of the component and a portion of the solid bonding-and-weak-adhesion layer.

According to embodiments of the present disclosure, a printable-component structure comprises a carrier substrate, a bonding layer disposed on the carrier substrate, a solid weak-adhesion layer disposed on the bonding layer, and a component comprising one or more posts protruding from a first side of the component. The one or more posts can be disposed in contact with the weak-adhesion layer such that no other portion of the component is in contact with the weak-adhesion layer other than the one or more posts. In some embodiments, the one or more posts comprise a noble metal such that only the noble metal contacts the weak-adhesion layer. In some embodiments, the weak-adhesion layer comprises a dielectric such that only the dielectric contacts the noble metal. In some embodiments, the one or more posts is two or more posts and a gap exists between a bottom side of the component and the weak-adhesion layer in a region bounded by the two or more posts. In some embodiments, the one or more posts are electrically conductive. In some embodiments, the component comprises at least a portion of a component circuit and the one or more posts are electrically connected to the at least a portion of a circuit. In some embodiments, an elastomeric stamp can be in contact with the component on a second side of the component opposite the first side. Embodiments can comprise adhering the component to a stamp and removing the component from the carrier substrate with the stamp, providing a target substrate, and contacting the component to the target substrate or to a layer (such as an adhesive layer) disposed on the target substrate with the stamp.

The present invention provides, among other things, structures and methods that enable micro-assembling micro-devices from a native source wafer onto a target substrate and electrically connecting the micro-devices on the target substrate in a way that is efficient, robust, and low cost.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figures 1A, 1B:
FIG. 1A is a cross section of a structure with a release layer in contact with a weak-adhesion layer according to illustrative embodiments of the present disclosure.
FIG. 1B is a cross section of a structure with a release layer in contact with a bonding layer according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present invention provides, among other things, structures, devices, and methods that enable micro-assembling micro-components from a carrier wafer onto a target substrate and electrically connecting the micro-components on the target substrate in a way that is efficient, robust, and low cost. The micro-assembly process can be micro-transfer printing using a stamp, for example a visco-elastic elastomeric stamp such as one including PDMS. In some such methods and according to embodiments of the present disclosure, micro-components are weakly adhered to a solid weak-adhesion layer of a carrier wafer and can be lifted directly off of (e.g., picked up from) the weak-adhesion layer with a stamp adhered to the micro-components (e.g., by van der Waals forces), transported to a target substrate, and printed onto (e.g., adhered to) the target substrate, and electrically connected on the target substrate, for example with thin-film wires or posts, or both. In some such methods, it is an advantage to only weakly adhere the micro-components to the carrier wafer to enable micro-component pick up from the carrier wafer with a stamp. Advantages of embodiments of the present disclosure can include more efficient use of expensive space on a native source wafer and improved pick-up yield.

FIGS. 1A and 1B illustrate simple structures according to embodiments of the present disclosure. As shown in FIGS. 1A and 1B, a printable-component structure 90 comprises a carrier substrate 50, a bonding layer 40 disposed on carrier substrate 50, a solid weak-adhesion layer 30 disposed on (e.g., at least a portion of) bonding layer 40, (e.g., at least a portion of) component 10 (e.g., a transfer-printable micro-component) disposed directly on (e.g., in direct physical contact with) (e.g., at least a portion of) weak-adhesion layer 30, and a release layer 20 disposed in contact with (e.g., at least a portion of) component 10. Weak-adhesion layer 30 has a weak adhesion to component 10 but can have a strong adhesion to bonding layer 40. In some embodiments, weak-adhesion layer 30 has a weaker adhesion to component 10 than to bonding layer 40. As shown in FIG. 1A, at least a portion of release layer 20 is in contact with weak-adhesion layer 30 but does not extend through weak-adhesion layer 30. As shown in FIG. 1B, at least a portion of release layer 20 extends through at least a portion of weak-adhesion layer 30 and is in contact with bonding layer 40.

In some embodiments, solid weak-adhesion layer 30 is disposed on bonding layer such that only a portion of solid weak-adhesion layer 30 is disposed on bonding layer (e.g., solid weak-adhesion layer 30 extends beyond bonding layer 40). In some embodiments, component 10 is disposed (e.g., directly) on weak-adhesion layer 30 such that only a portion of component 10 is disposed on weak-adhesion layer 30 (e.g., component 10 extends beyond weak-adhesion layer 30). In some embodiments, component 10 is disposed (e.g., directly) on weak-adhesion layer 30 such that component is disposed on only a portion of weak-adhesion layer 30 (e.g., weak-adhesion layer 30 extends beyond component 10). In some embodiments, release layer 20 is disposed on (e.g., in contact with) component 10 such that only a portion of component 10 is disposed on release layer 20 (e.g., release layer 20 extends beyond component 10). In some embodiments, release layer 20 is disposed on (e.g., in contact with) component 10 such that component 10 is disposed on only a portion of release layer 20 (e.g., component 10 extends beyond release layer 20).

Component 10 can comprise a component bottom layer 18 in contact with weak-adhesion layer 30. Component bottom layer 18 can comprise a material that weakly adheres to weak-adhesion layer 30 even if other portions of component 10 would, in the absence of component bottom layer 18, adhere more strongly to weak-adhesion layer 30. That is, in some embodiments, weak-adhesion layer 30 has a weak adhesion to component 10 because of component bottom layer 18. Component bottom layer 18 can be a noble metal, for example gold, and weak-adhesion layer 30 can be a dielectric material such as an oxide, for example silicon dioxide, a nitride such as silicon nitride, a metal oxide such as ITO, or a polymer such as an acrylic adhesive, a polybenzoxazole (PBO), or SUB. In some embodiments, weak-adhesion layer 30 can be or include a metal. In general, weak-adhesion layer 30 and component 10 (or component bottom layer 18) adhere weakly (e.g., less than stamp 70 (or stamp post 72) adheres) to component 10. Those of ordinary skill in the art will appreciate that various combinations of materials can be used to impart the desired weak adhesion. As specific examples, weak-adhesion layer 30 can comprise silicon dioxide and component bottom layer 18 can comprise gold or weak-adhesion layer 30 can comprise gold and component bottom layer 18 can comprise silicon dioxide.

Figure 3A:
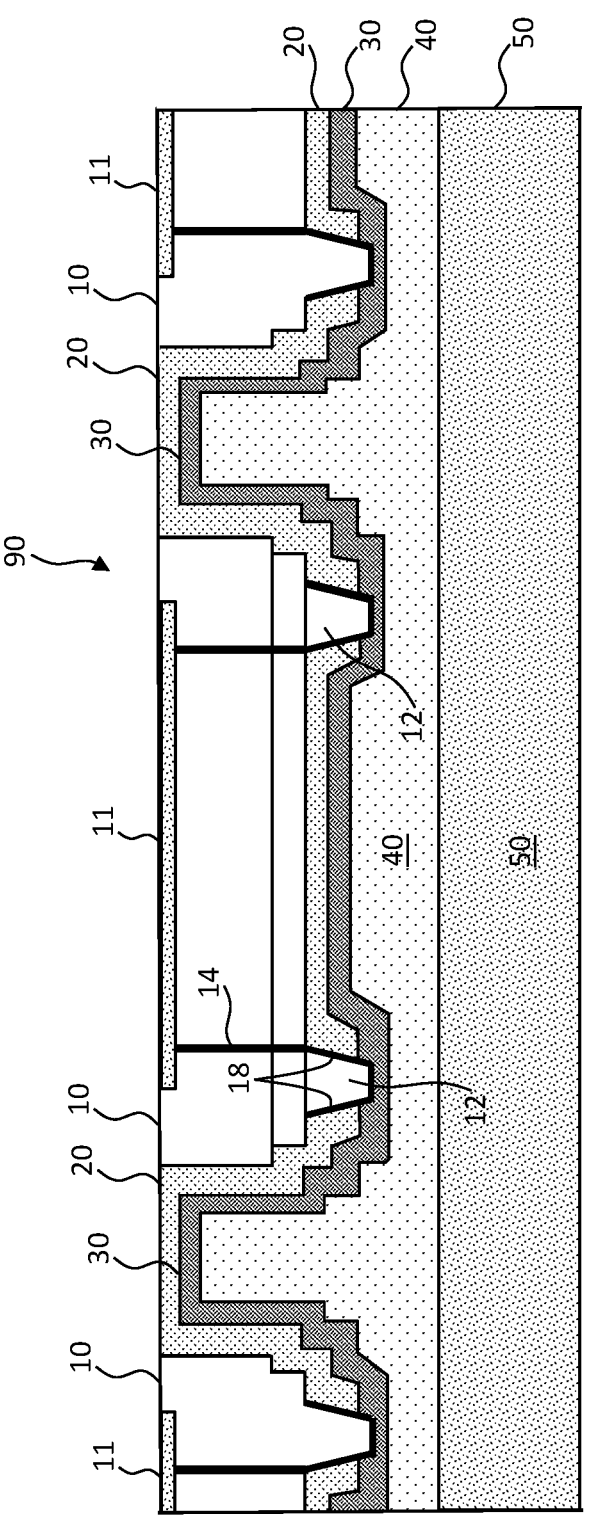
FIG. 3A is a cross section of a structure comprising components with posts in contact with a weak-adhesion layer according to illustrative embodiments of the present disclosure.
Figure 3B:
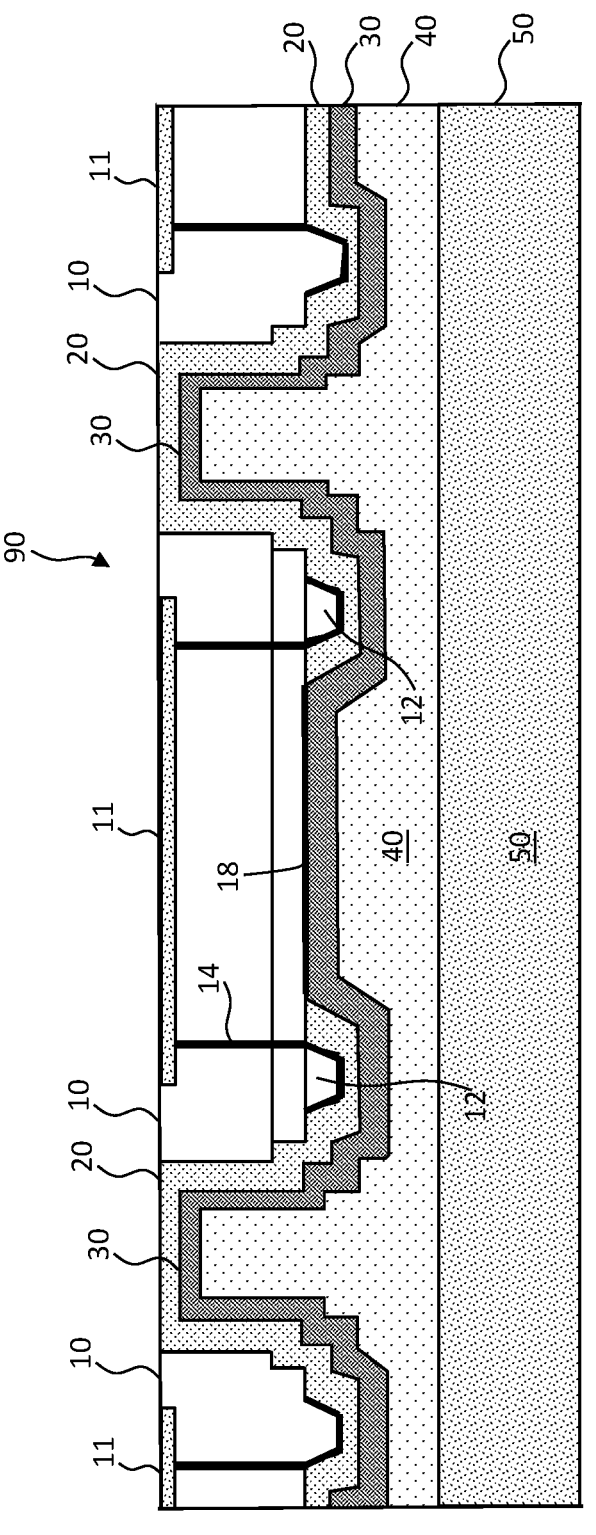
FIG. 3B is a cross section of a structure comprising components with posts not in contact with a weak-adhesion layer according to illustrative embodiments of the present disclosure.

Component 10 can be a semiconductor component 10, for example a silicon or compound semiconductor component 10 (e.g., including an integrated circuit or portion thereof). Component 10 can have multiple layers, for example including an epitaxial semiconductor layer in or on which a component circuit 11 (as shown in FIGS. 3A and 3B) can be disposed, a bulk semiconductor layer, patterned or unpatterned conductive or dielectric layers, and component bottom layer 18, where bottom (or bottom side) designates a side of component 10 adjacent weak-adhesion layer 30 and top (or top side) designates a side of component 10 opposite weak-adhesion layer 30.

Component 10 can be an integrated circuit, for example a silicon or compound integrated circuit. In some embodiments, component 10 is an optoelectronic or photonic device, for example a light-emitting device such as a light-emitting diode (LED) or laser or a light-responsive device such as a photodiode. Carrier substrate 50 can be a glass substrate, a semiconductor substrate, for example a silicon wafer, a quartz substrate, or another substrate used in the integrated circuit and display industries having a suitable surface for bonding layer 40.

Bonding layer 40 can be an adhesive, such as a resin, epoxy, or photoresist. Bonding layer 40 can be a cured or curable adhesive, for example a cross-linked adhesive that is coated on carrier substrate 50 or weak-adhesion layer 30 (e.g., by spin or spray coating) as a liquid and then cured with heat or radiation 84 (such as ultraviolet radiation 84, for example as shown in FIG. 5Q, which is discussed below) after adhering weak-adhesion layer 30 to carrier substrate 50.

Release layer 20 is a sacrificial layer 20 that is removed (e.g., by dry or wet etching) to release component 10 from carrier substrate 50 and bonding layer 40 so that component 10 is physically connected to carrier substrate 50 and bonding layer 40 only with an area of component 10 in direct contact with weak-adhesion layer 30. Release layer 20 can be, for example, but not limited to, an organic polymer, such as a spin- or spray-coatable curable photoresist or polydimethylglutarimide (PMGI), for example a lift-off resist (LOR), or a vapor-deposited polymer such as parylene. A suitable etchant for such organic release layer 20 materials can be an aqueous developer or oxygen plasma. In some embodiments, release layer 20 can be an inorganic material such as silicon, germanium, or silicon nitride deposited by sputtering or evaporation that can be etched by fluorine-based plasmas or $XeF_2$. Release layer 20 can be disposed on any one or combination of portions of bonding layer 40, weak-adhesion layer 30, and component 10, and then etched. Thus, release layer 20 can be a removable (e.g., etchable) material or, after etching, release layer 20 can be a gap or open space in printable-component structure 90.

Figures 2A, 2B:
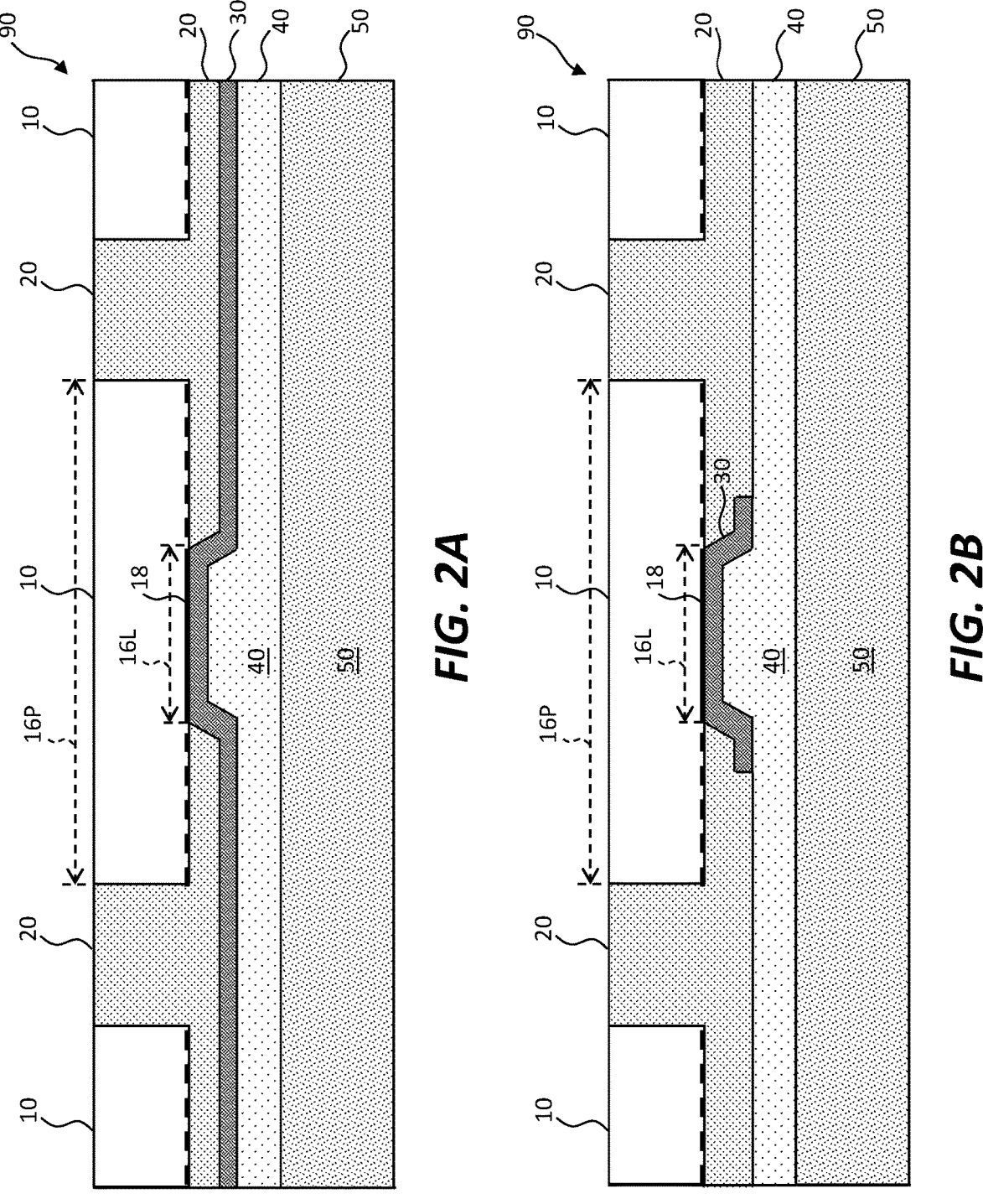
FIG. 2A is a cross section of with a reduced area of a component in contact with a weak-adhesion layer according to illustrative embodiments of the present disclosure.
FIG. 2B is a cross section of a structure taken across both cross section lines A and B of FIG. 2D with a reduced area weak-adhesion layer according to illustrative embodiments of the present disclosure.
Figure 2C:
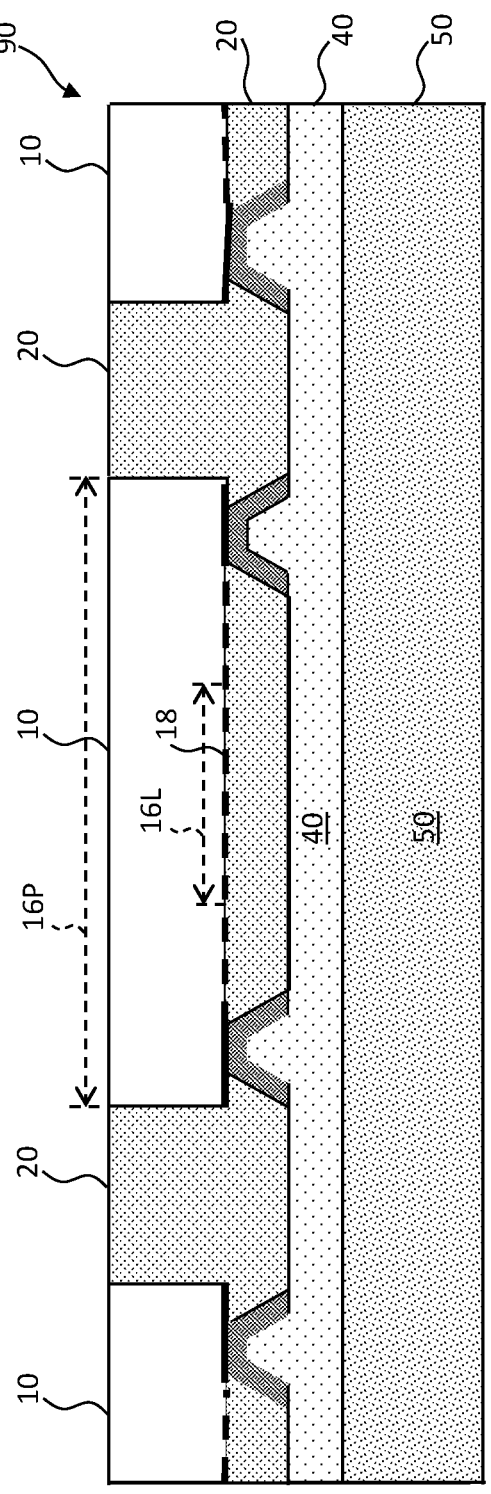
FIG. 2C is a cross section of a structure with multiple reduced areas of a weak-adhesion layer according to illustrative embodiments of the present disclosure.
Figure 2D:
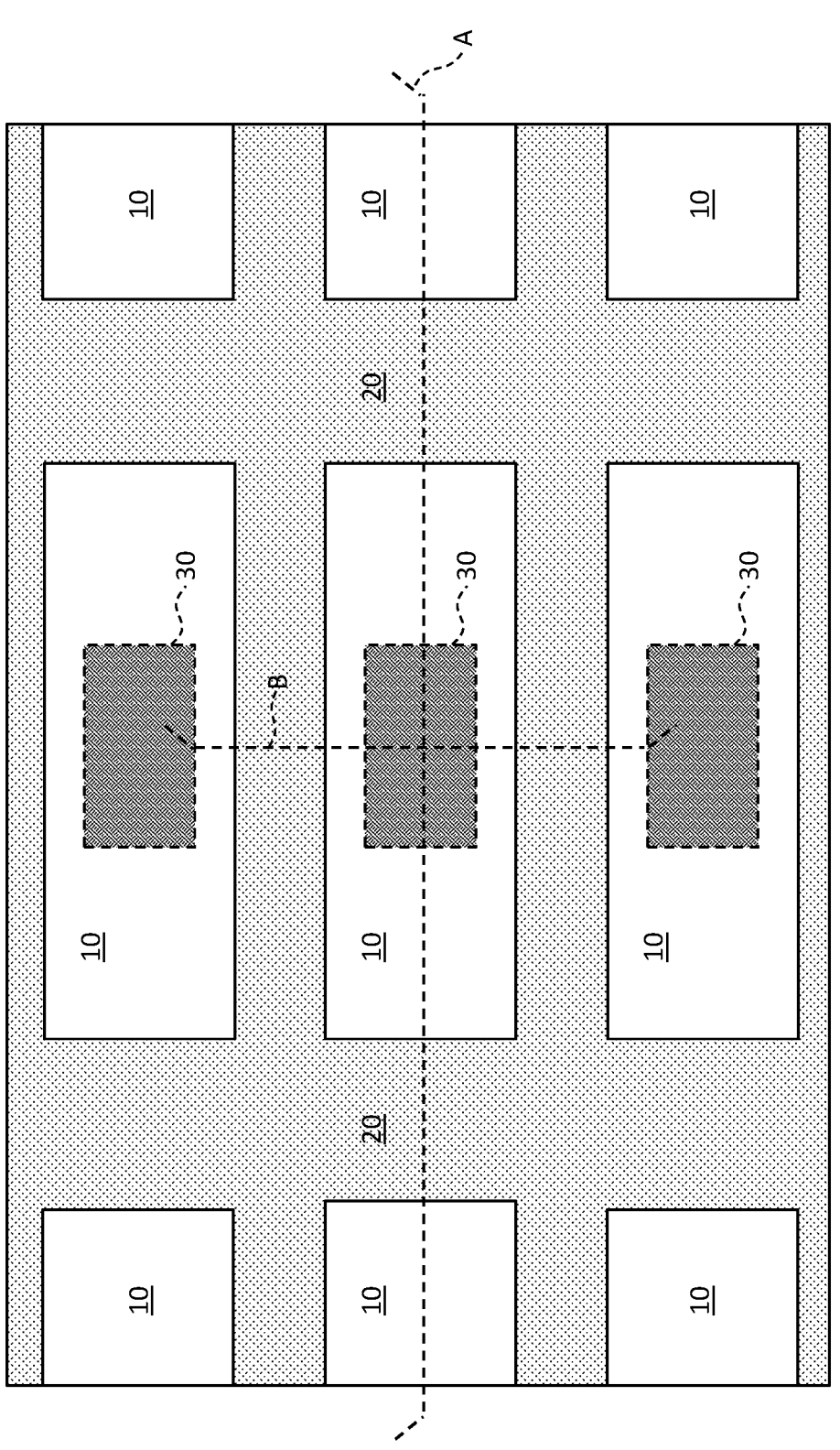
FIG. 2D is a plan view corresponding to FIG. 2B according to illustrative embodiments of the present disclosure.
Figure 2E:
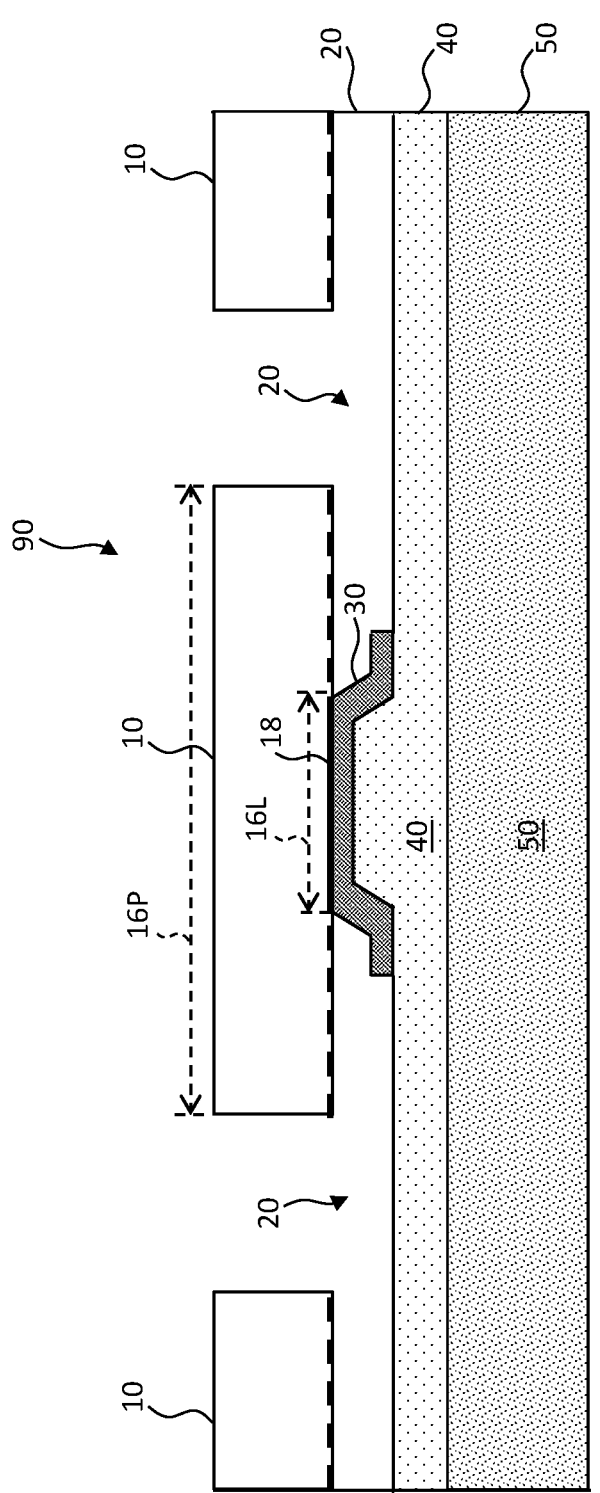
FIG. 2E is a cross section of a structure corresponding to FIG. 2B taken across both cross section lines A and B of FIG. 2D with an etched release layer according to illustrative embodiments of the present disclosure.

As shown in FIGS. 2A, 2B, 2D, and 2E, release layer 20 is disposed between (e.g., at least partially or entirely between) component 10 and bonding layer 40 and, optionally, between component 10 and a portion of weak-adhesion layer 30. Weak-adhesion layer 30 can extend over the area of carrier substrate 50 and bonding layer 40, for example as shown in FIG. 2A. As shown in the cross section of FIGS. 2B and 2E and plan view of FIG. 2D, weak-adhesion layer 30 need not extend over the entire area of carrier substrate 50 and bonding layer 40; weak-adhesion layer 30 can be present only where weak-adhesion layer 30 is in direct physical contact with component 10, e.g., in direct physical contact with component bottom layer 18 of component 10. Similarly, component bottom layer 18 need not extend over the entire bottom side of component 10 but can be present only where weak-adhesion layer 30 is in physical contact with component 10. In FIGS. 2A, 2B, and 2E, component bottom layer 18 is indicated with dashes where component bottom layer 18 can be, but is not necessarily, present on the bottom side of component 10. By contacting only a portion of the bottom side of component 10 to weak-adhesion layer 30, adhesion between component 10 and weak-adhesion layer 30 is reduced, facilitating removal of component 10 from weak-adhesion layer 30. FIG. 2E illustrates printable-component structure 90 with release layer 20 etched to form a gap 20 and release component 10 from carrier substrate 50 and bonding layer 40.

As shown in FIGS. 3A and 3B, component 10 can comprise one or more posts 12 that protrude from component 10. Posts 12 can exclusively comprise non-conductive materials or electrical conductors such as metals or conductive metal oxides or can comprise a dielectric material such as an epoxy or resin coated with an electrically conductive material. As shown in FIG. 3A posts 12 can be in direct and physical contact with weak-adhesion layer 30 and can contact weak-adhesion layer 30 or can extend into weak-adhesion layer 30. In some embodiments, only posts 12 (or portions of post(s) 12) of component 10 are in contact with weak-adhesion layer 30. As shown in FIG. 3B, in some embodiments, posts 12 are not in contact with weak-adhesion layer 30 and a bottom side of component 10 comprises a component bottom layer 18 in contact with weak-adhesion layer 30 in contact with bonding layer 40. Posts 12 can comprise an electrically conductive layer electrically connected to component circuit 11 through electrical via 14. Thus, a portion of release layer 20 can be disposed between a portion of component 10 and corresponding portions of weak-adhesion layer 30 so that post(s) 12 extend through at least a portion of release layer 20 onto or into weak-adhesion layer 30. Post(s) 12 can comprise or be coated with component bottom layer 18 so that adhesion between posts(s) 12 and weak-adhesion layer 30 is weak as desired. For example, post(s) 12 can be coated with gold or can be gold. (Bottom side of component 10 can also be coated with a bottom layer 18 of gold or can be gold, as in some embodiments with or without post(s) 12.) Post(s) 12 can have a sharp distal end, for example, the distal end of post(s) 12 can have a smaller area than a proximal end of post(s) 12, where the distal end of posts (12) is in contact with weak-adhesion layer 30. Component 10 can be in contact with weak-adhesion layer 30 solely with post(s) 12.

In general, contact points between component 10 and weak-adhesion layer 30 can be disposed at a center point or center area, at corners or corner areas, or at edges or edge areas. Contact points between component 10 and weak-adhesion layer 30 can be distributed regularly or randomly in one or two dimensions and with any desired aspect ratio. According to embodiments of the present disclosure, there is no limitation on the number, location, or shape of contact points between component 10 and weak-adhesion layer 30.

In some embodiments, fewer and/or smaller contact points are preferred, which can be achieved, for example, by having only post(s) 12 of component 10 contact weak-adhesion layer 30.

In embodiments of the present disclosure and as shown in FIG. 3A, components comprise a at least a portion of component circuit 11 formed in or on an epitaxial layer or process side of component 10. Post(s) 12 can be electrically conductive and can be electrically connected to at least a portion of component circuit 11, for example with an electrical via 14 such as a through-silicon via. In some such embodiments, component bottom layer 18 is electrically connected through electrical via 14 to component circuit 11. Thus, component bottom layer 18 can serve to provide weak adhesion to weak-adhesion layer 30 and to comprise an electrically conductive layer on posts(s) 12 or be electrically conductive post(s) 12.

Figure 4:
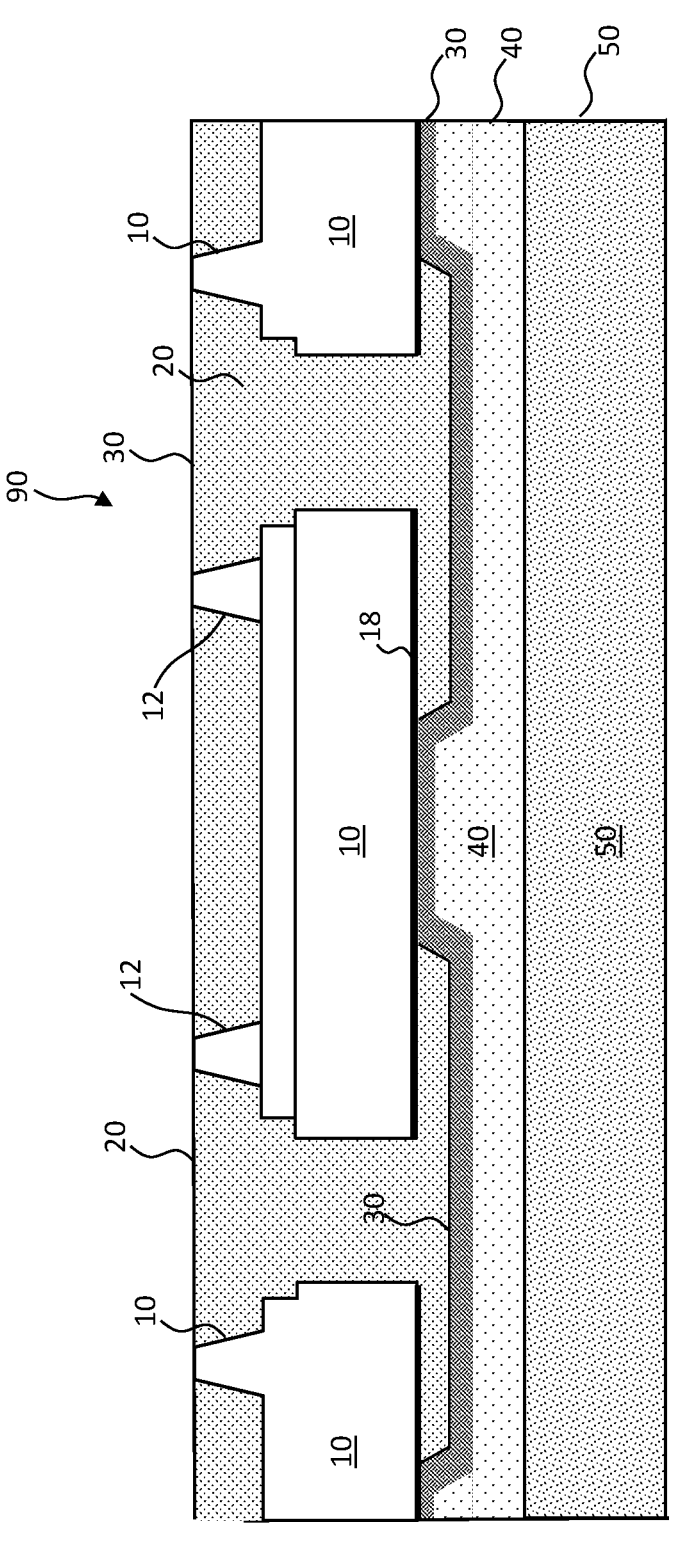
FIG. 4 is a cross section of a structure comprising components with posts spatially inverted with respect to the orientation of the component in FIG. 3A according to illustrative embodiments of the present disclosure.

As illustrated in FIG. 4, in some embodiments of the present disclosure, component 10 comprises posts 12 disposed on a side of component 10 opposite weak-adhesion layer 30 so that posts 12 are not in contact with weak-adhesion layer 30. Component bottom layer 18 can be disposed on the bottom side of component 10 adjacent to and in contact with weak-adhesion layer 30. Such an arrangement can facilitate or enable alternative construction methods for posts 12. In some such embodiments, component bottom layer 18 can be insulated from component circuit 11, for example with a layer of silicon dioxide, where component circuit 11 is formed in an epitaxial layer on the bottom side of component 10.

Figures 5A, 5B, 5C, 5D:
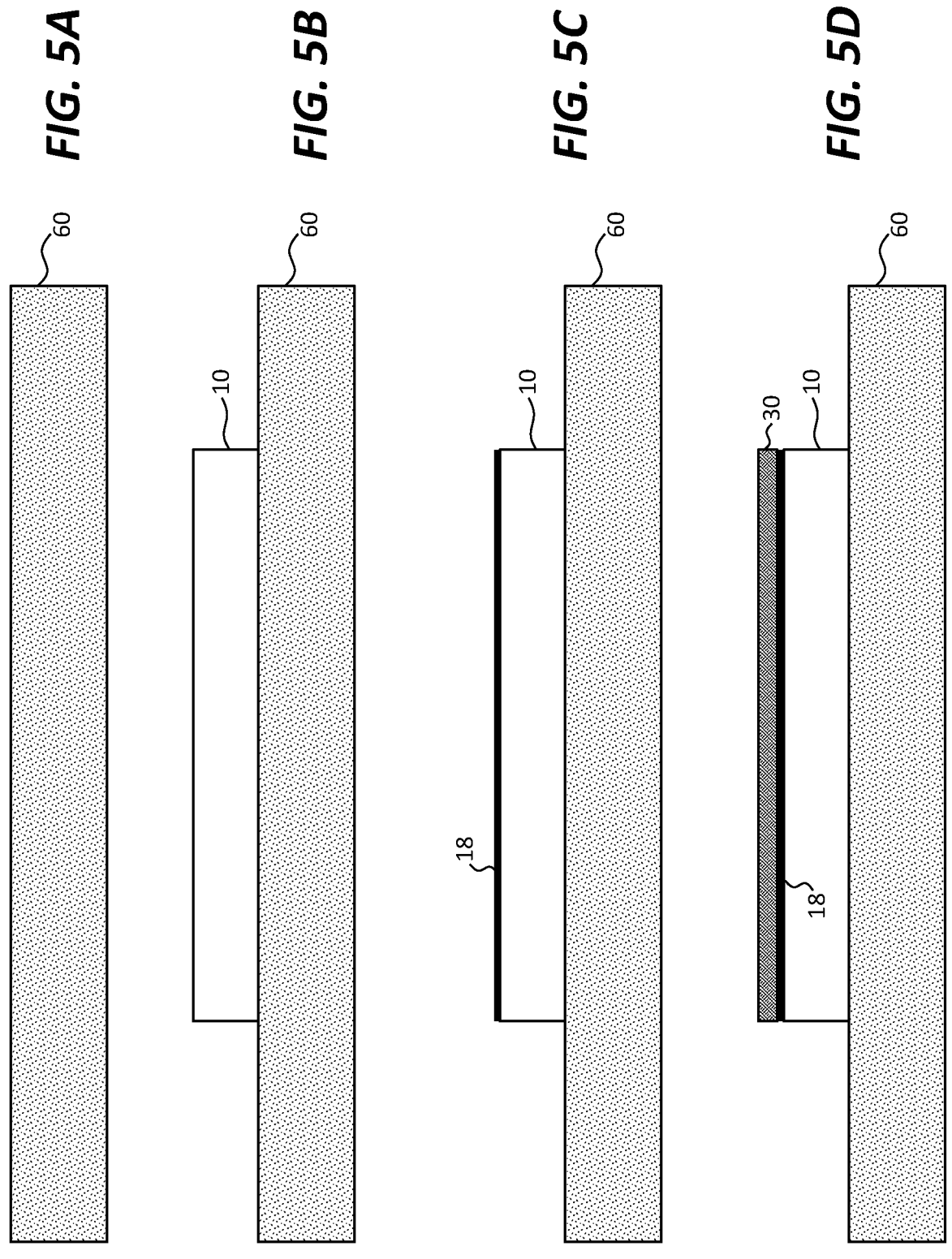
FIGS. 5A-5S are successive cross sections illustrating steps of methods according to illustrative embodiments of the present disclosure.
Figures 5E, 5F, 5G:
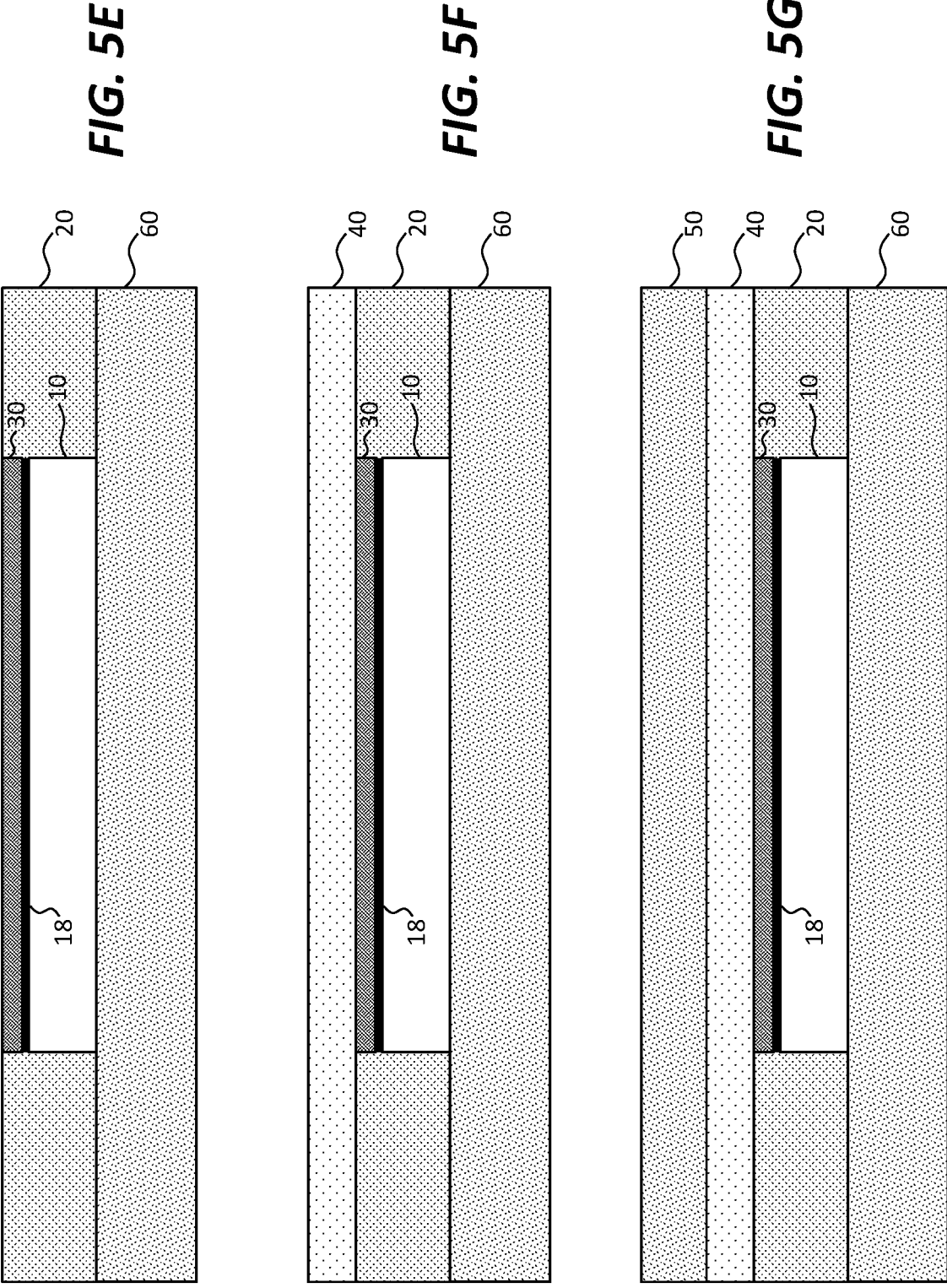
Figures 5H, 5I, 5J:
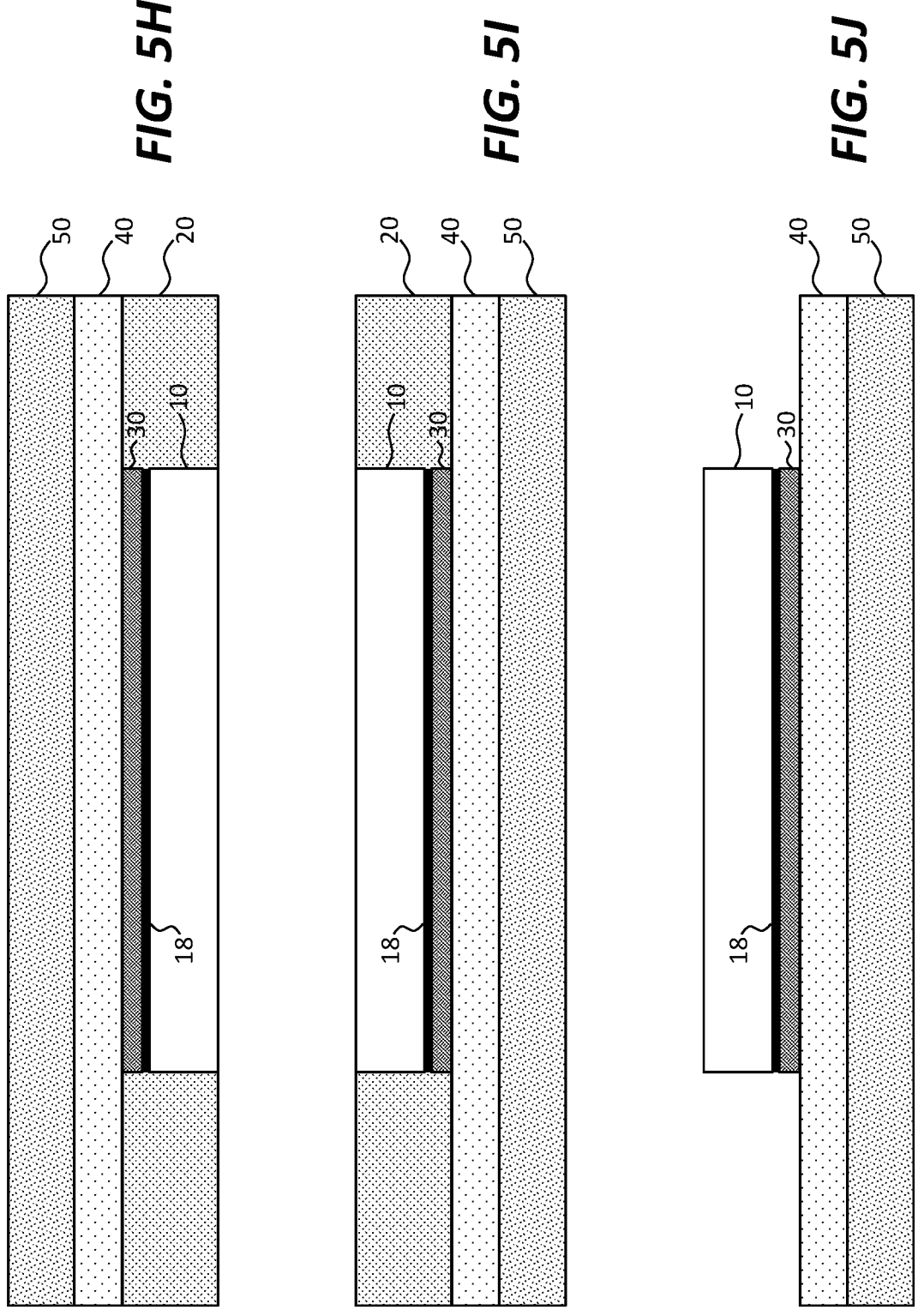
Figures 5K, 5L:
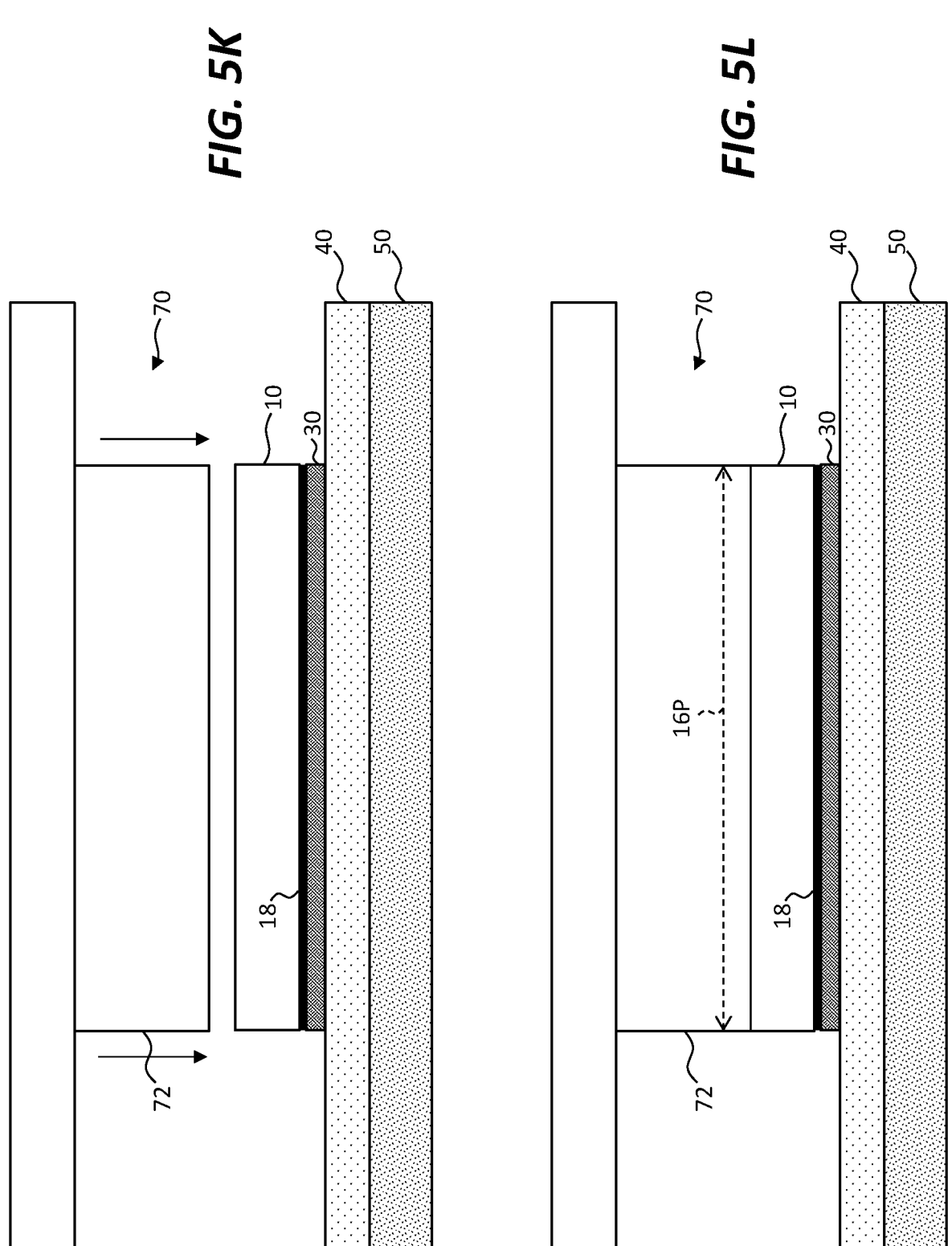
Figures 5M, 5N:
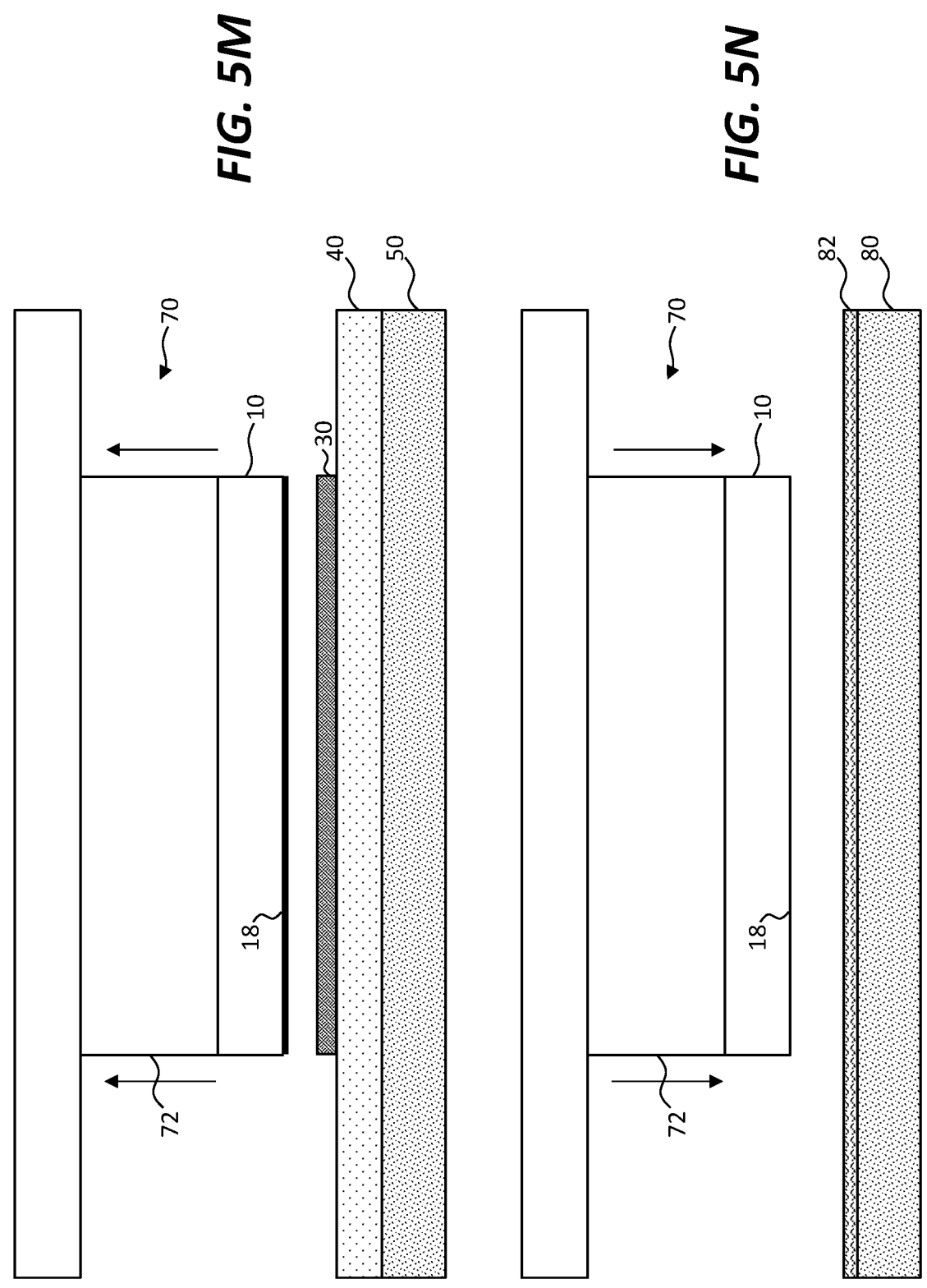
Figures 5O, 5P:
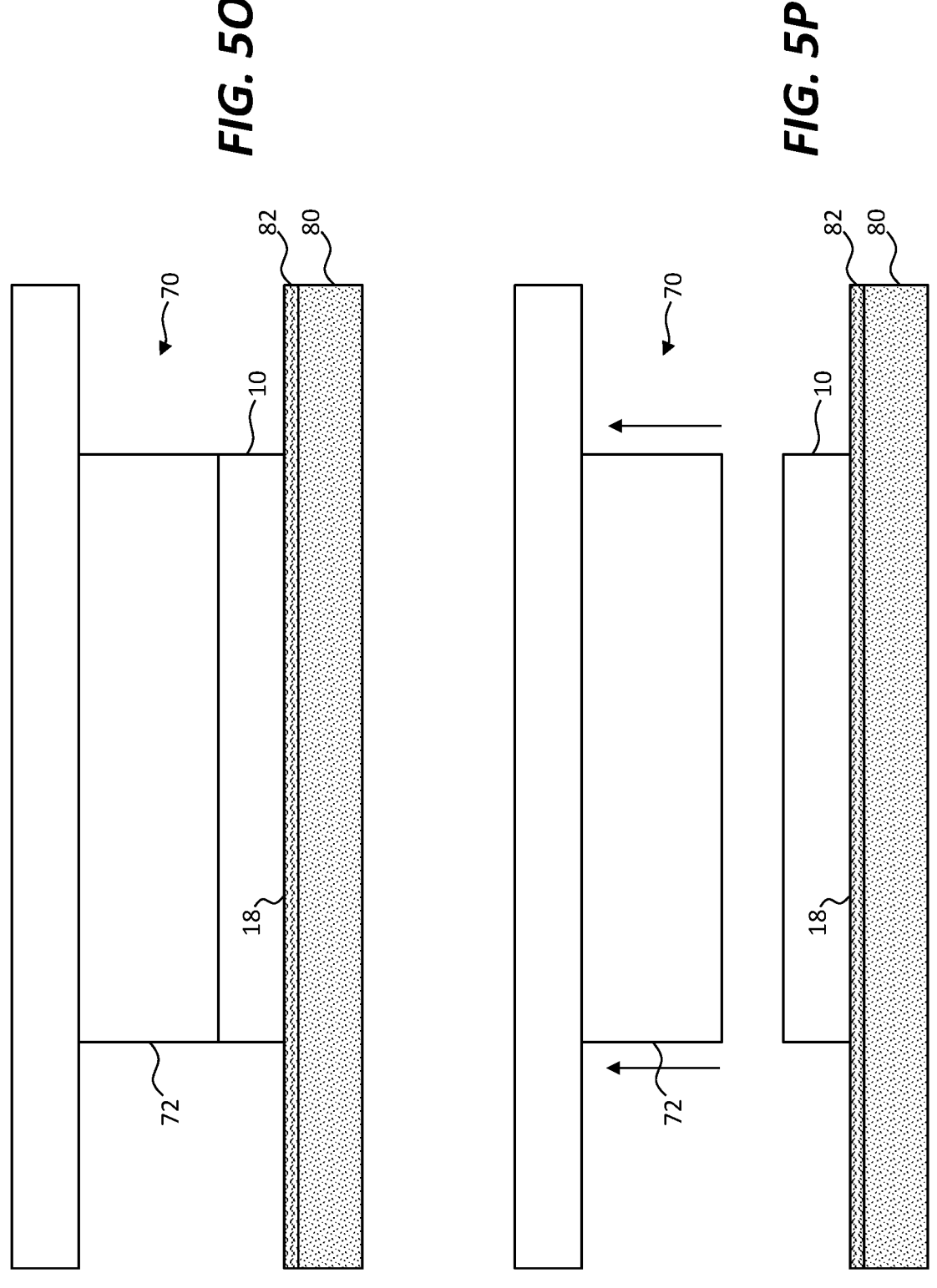
Figures 5Q, 5R, 5S:
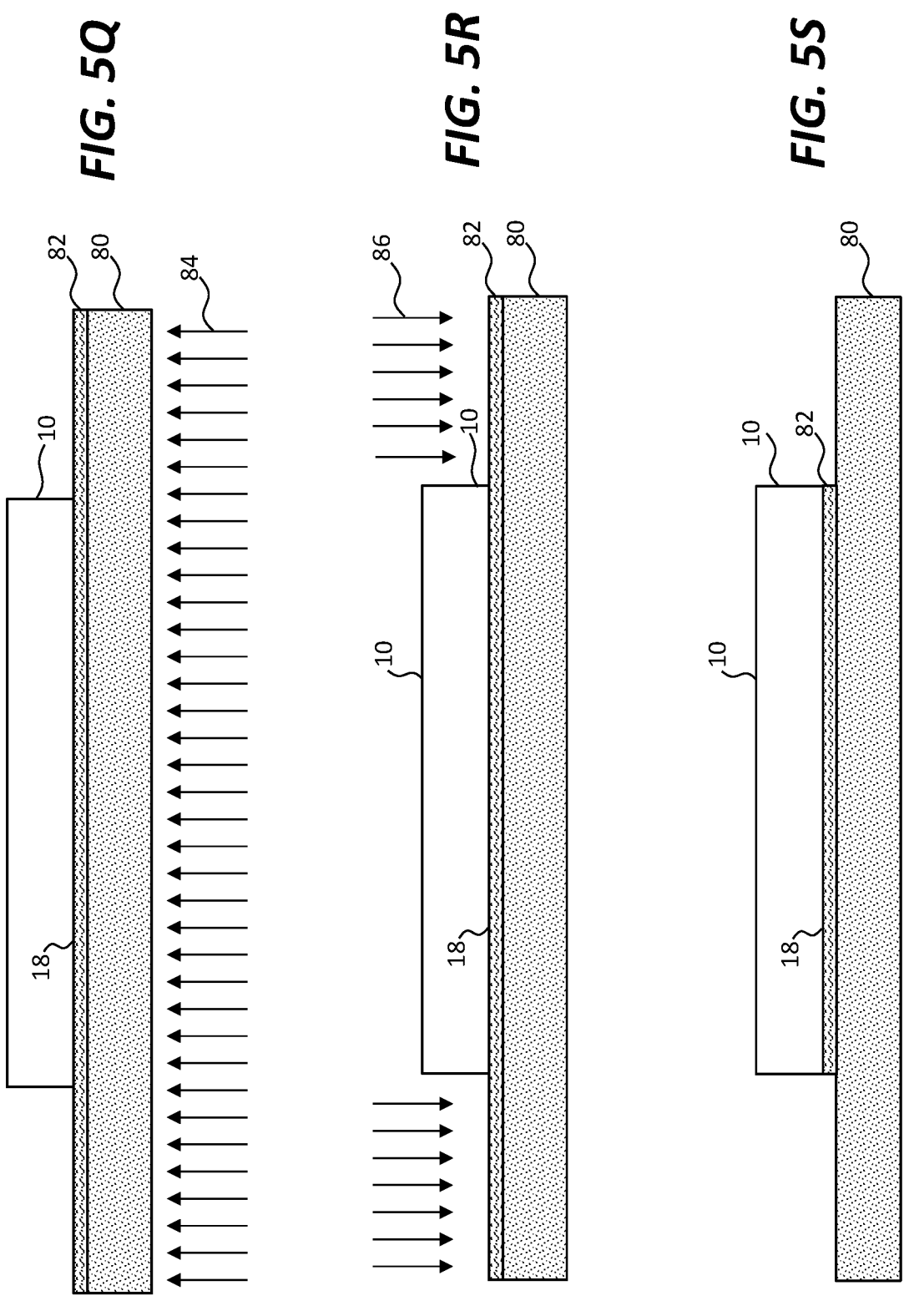
Figure 6:
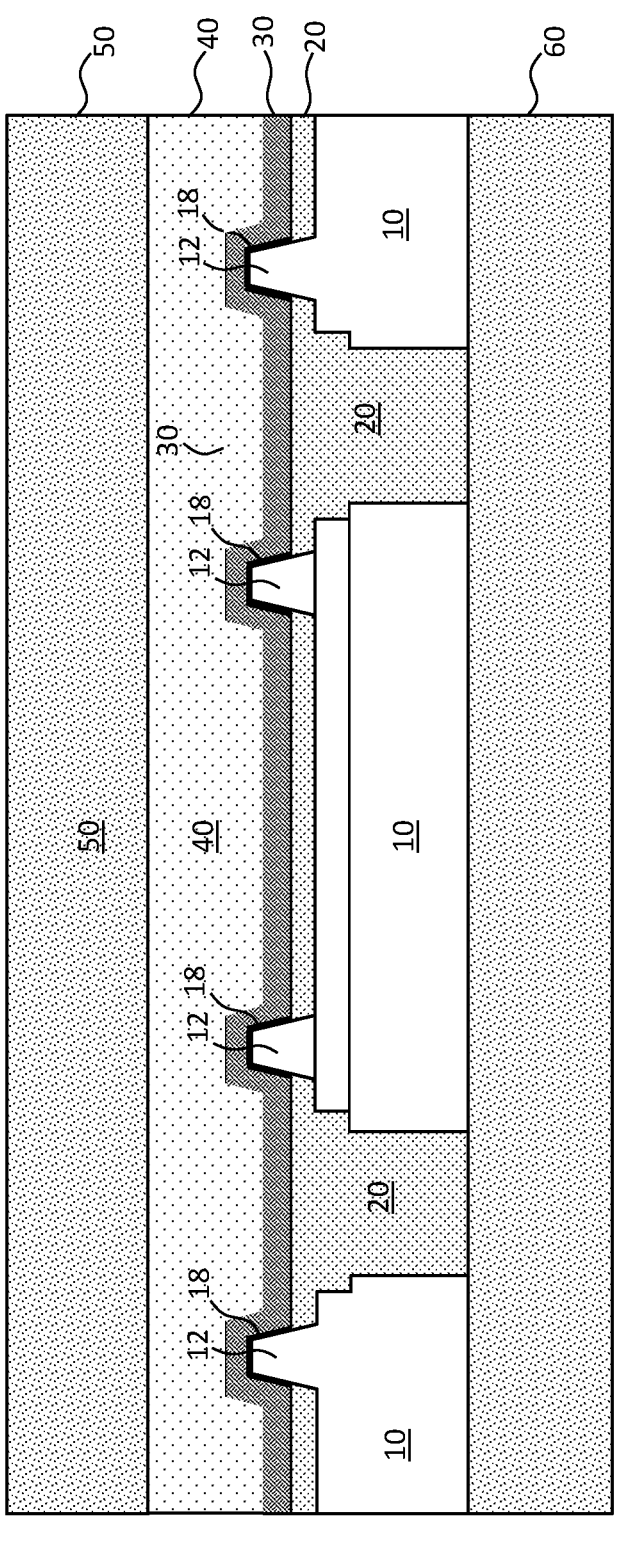
FIG. 6 is a cross section of a structure according to illustrative embodiments of the present disclosure.
Figure 8:
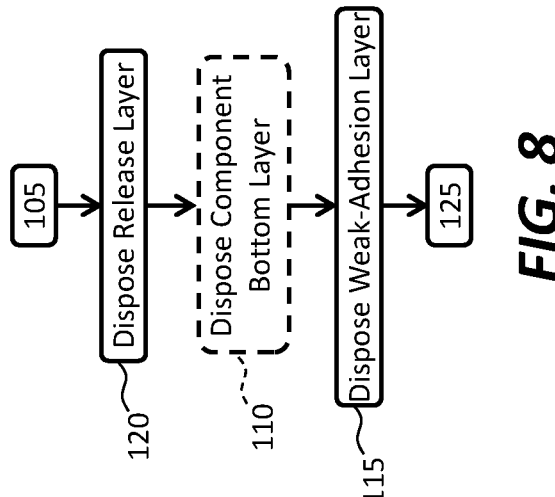
FIGS. 7-9 are flow charts illustrating methods according to illustrative embodiments of the present disclosure.
Figure 7:
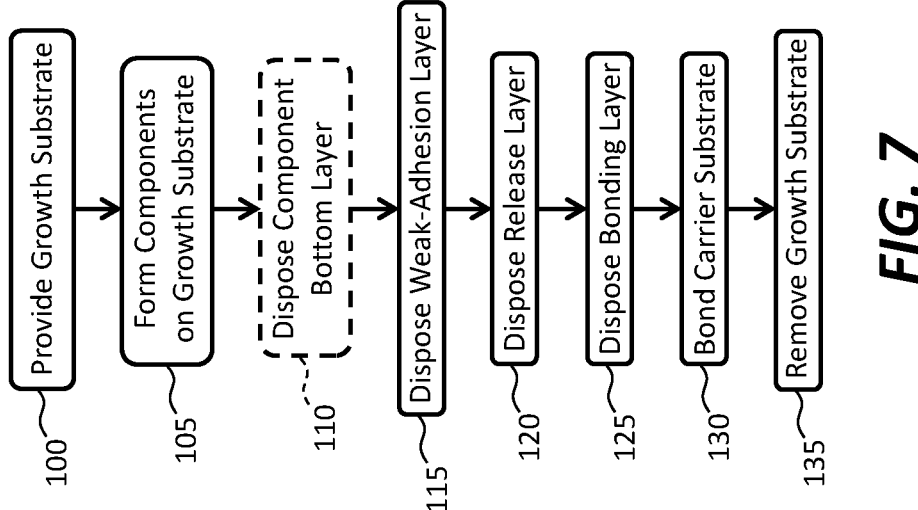
Figure 9:
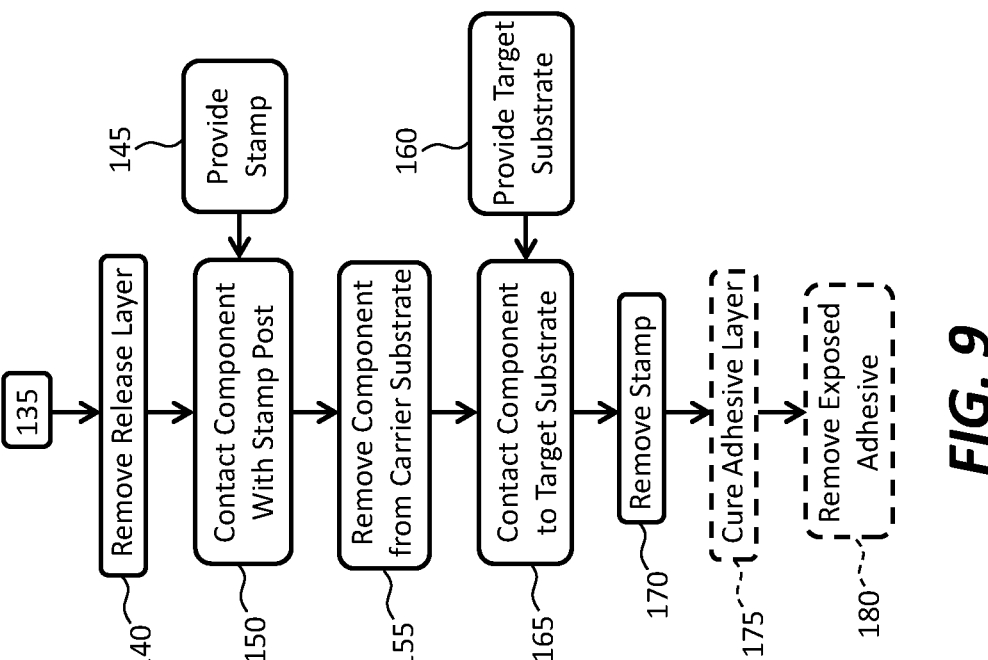

According to embodiments of the present disclosure and as illustrated in the sequential cross sections of FIGS. 5A-5S and FIG. 6 and the flow diagrams of FIGS. 7, 8, and 9, a method of making a printable-component structure 90 comprises providing a growth substrate 60 (e.g., a native component source wafer 60 such as sapphire, silicon carbide, silicon, or a compound semiconductor substrate) as shown in FIG. 5A in step 100 and constructing a component 10 on growth substrate 60 as shown in FIG. 5B in step 105, for example using photolithographic methods and materials. Component 10 can comprise one or more posts 12 protruding from component 10, e.g., as shown in FIG. 3, 4, or 6. Posts 12 can be electrically conductive and can be electrically connected to a circuit disposed in or on or is part of component 10. Optionally, component bottom layer 18 is coated over or forms at least some portion of the side of component 10 opposite growth substrate 60 in step 110 as shown in FIG. 5C.

In some embodiments, at least some portion of component 10, and optionally some portion of growth substrate 60, is coated with weak-adhesion layer 30 in step 115 as shown in FIG. 5D and release layer 20 is coated over weak-adhesion layer 30 and, optionally, growth substrate 60, in step 120 as shown in FIG. 5E. In some embodiments and as shown in FIG. 6 and the flow diagram of FIG. 8, at least some portion of component 10, and optionally some portion of growth substrate 60, is coated with release layer 20 in step 120, some portion of component 10 protrudes through coated release layer 20 (e.g., post(s) 12), and weak-adhesion layer 30 is coated over at least the protruding portion (e.g., post(s) 12) in step 115 as shown in FIG. 6. Optionally, weak-adhesion layer 30 can also be coated over release layer 20. Thus, steps 115 and 120 can be done in different orders depending on whether a portion of component 10 can protrude through release layer 20. Furthermore, component bottom layer 18 can be coated over a protruding portion (e.g., post(s) 12) of component 10 in optional step 110 after release layer 20 is coated and before weak-adhesion layer 30 is disposed so that step 110 can be done after step 120 and before step 115. Weak-adhesion layer 30 and component bottom layer 18 can be sputtered or evaporated and can be patterned using masking and etching steps as is commonly found in photolithographic processes. Component bottom layer 18 can be a metal, a noble metal, or gold. Weak-adhesion layer 30 can be a dielectric such as silicon dioxide. Release layer 20 can comprise an organic polymer and can be spin or spray coated, or vapor deposited, or can comprise an evaporated or sputtered inorganic material such as silicon, germanium, or silicon nitride.

As shown in step 125 of FIG. 7, once the weak-adhesion layer 30 and release layer are disposed and suitably patterned, bonding layer 40 can be disposed on weak-adhesion layer 30 and optionally release layer 20, for example by spin or spray coating a suitable organic adhesive, such as a resin, epoxy, or photoresist, as illustrated in FIG. 5F or FIG. 6. Carrier substrate 50 can then be adhered to bonding layer 40 in step 130 and as shown in FIGS. 5G and 6 by lamination. Growth substrate 60 can then be removed, for example by back grinding, etching, or laser lift-off in step 135 and as shown in FIG. 5H, to expose at least some portions of release layer 20 and, optionally, component 10. FIG. 5I illustrates the same structure as FIG. 5H but inverted (flipped over) for clarity of illustration and understanding in the following Figures.

As shown in FIG. 5J, release layer 20 is etched or otherwise removed in step 140, for example with an aqueous or dry etch that selectively etches release layer 20 so that component 10 is exposed (if covered with release layer 20) and leaving component 10 substantially unharmed, e.g., component 10 remains functional and is exposed. Component 10 is then physically connected to carrier substrate 50 only with weak-adhesion layer 30 and weak-adhesion layer 30 is physically connected to carrier substrate 50 with bonding layer 40. A stamp 70 with a stamp post 72 is provided in step 145 as shown in FIG. 5K and contacted (e.g., adhered with vander Waals forces) to component in step 150 as shown in FIG. 5L. Stamp 70 is removed with component 10 from bonding layer 40 and carrier substrate 50 in step 155 and as shown in FIG. 5M.

According to embodiments of the present disclosure, weak-adhesion layer 30 is weakly adhered to component 10 with a force that is less than the adhesion between stamp post 72 (or stamp 70) and component 10 (when stamp post 72 (or stamp 70) is in contact with component 10), enabling removal of component 10 from weak-adhesion layer 30, bonding layer 40, and carrier substrate 50. Any suitable combination of weak-adhesion layer 30 materials and component 10 materials (e.g., including component bottom layer 18 materials in contact with weak-adhesion layer 30) that have a relative adhesion less than the adhesion between stamp post 72 and component 10 can be used. The adhesion force between component 10 and weak-adhesion layer 30 can also be controlled by controlling the area of component 10 in contact with weak-adhesion layer 30. A relatively small contact area 16L between component 10 and weak-adhesion layer compared to a relatively large stamp contact area 16P between stamp post 72 and component 10 can facilitate component 10 pick up and removal from carrier substrate 50 by stamp post 72 (e.g., step 155) by reducing the component 10 relative adhesion to weak-adhesion layer 30 with respect to stamp post 72, as illustrated in FIGS. 2A, 2B, and 2E.

A target substrate 80 is provided in step 160. Target substrate 80 can be coated with an optional adhesive layer 82 or can comprise an adhesive layer 82. In step 165 and as shown in FIG. 5N, stamp 70 and component 10 are transported to target substrate 80 and component 10 is contacted to target substrate 80 and any adhesive layer 82 in step 165 as shown in FIG. 5O. The motion of stamp 70 (and component 10) can be controlled by an optomechatronic motion platform in combination with fiducial marks on component 10, target substrate 80, and carrier substrate 50. Stamp 70 is removed in step 170, leaving component 10 adhered to target substrate 80, as shown in FIG. 5P. If adhesive layer 82 is present, adhesive layer 82 can be cured, for example with heat or electromagnetic radiation 84, in optional step 175 and as shown in FIG. 5Q. Any unwanted remaining adhesive in adhesive layer 82 can be removed with a field etch, for example an oxygen plasma etch, in step 180 and as shown in FIG. 5R, leaving component adhered to target substrate 80 as shown in FIG. 5S.

Figure 10A:
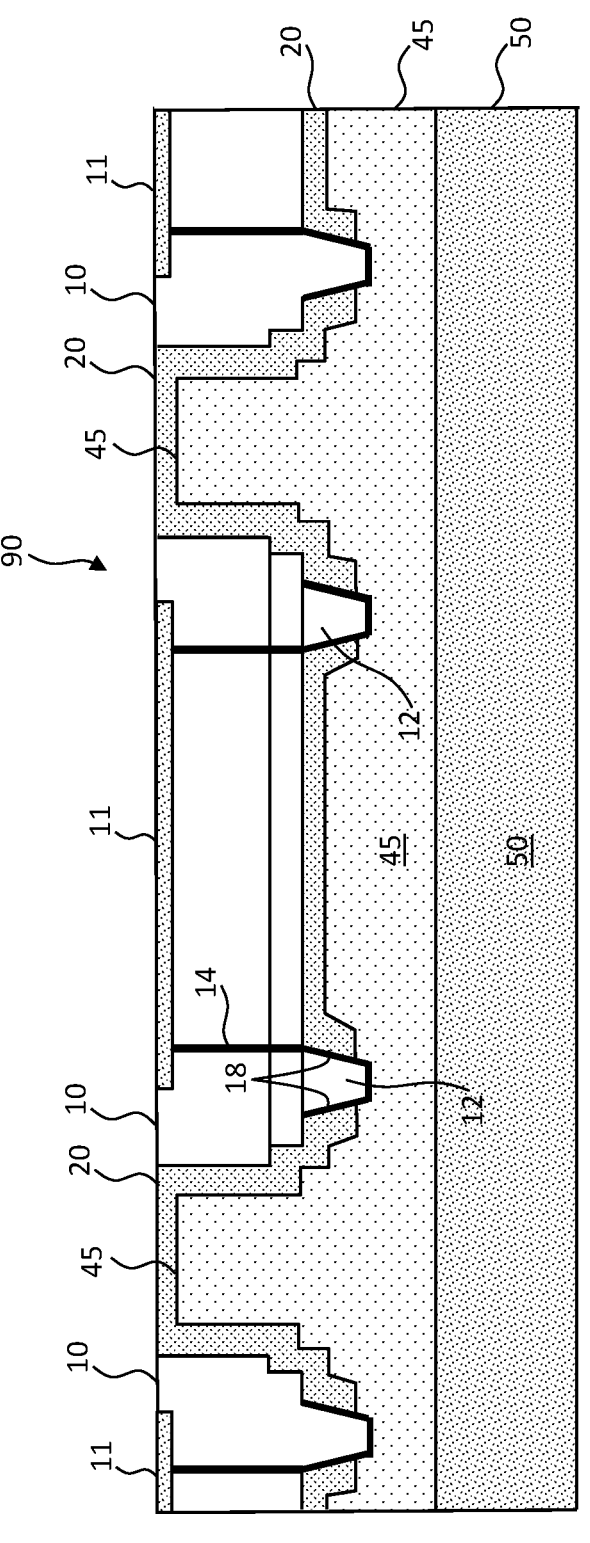
FIGS. 10A-10C are cross sections illustrating structures and methods according to illustrative embodiments of the present disclosure.
Figure 10B:
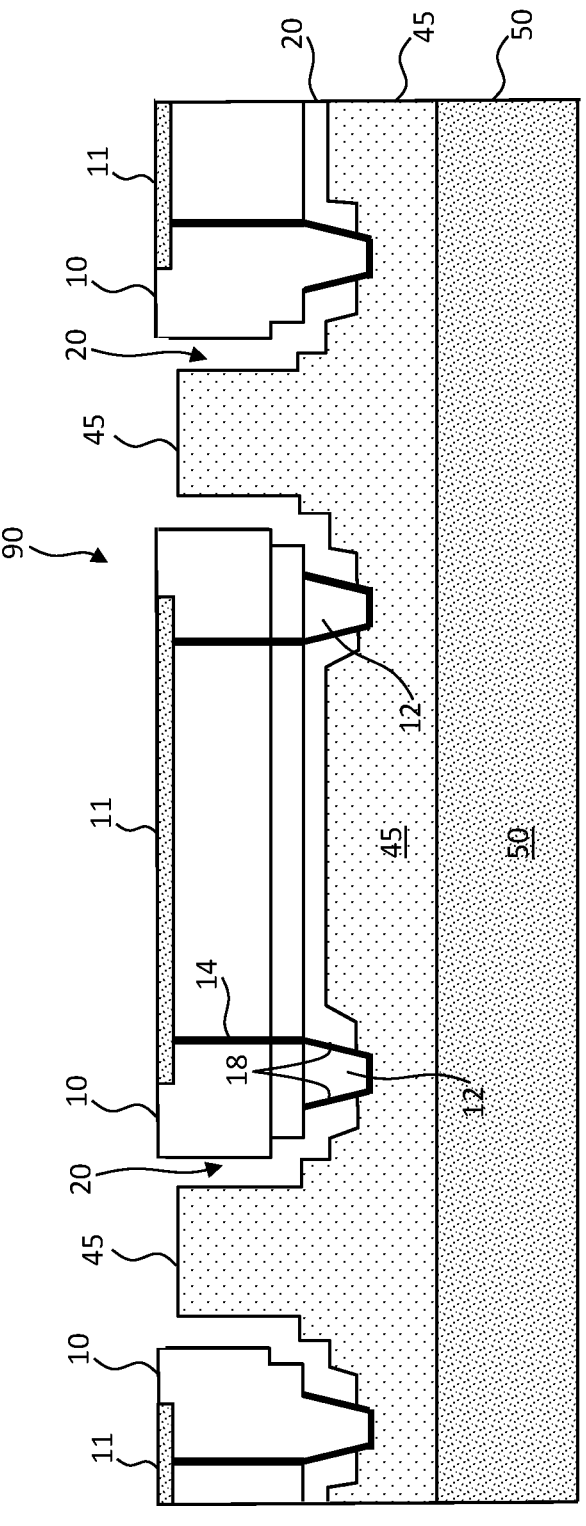
Figure 10C:
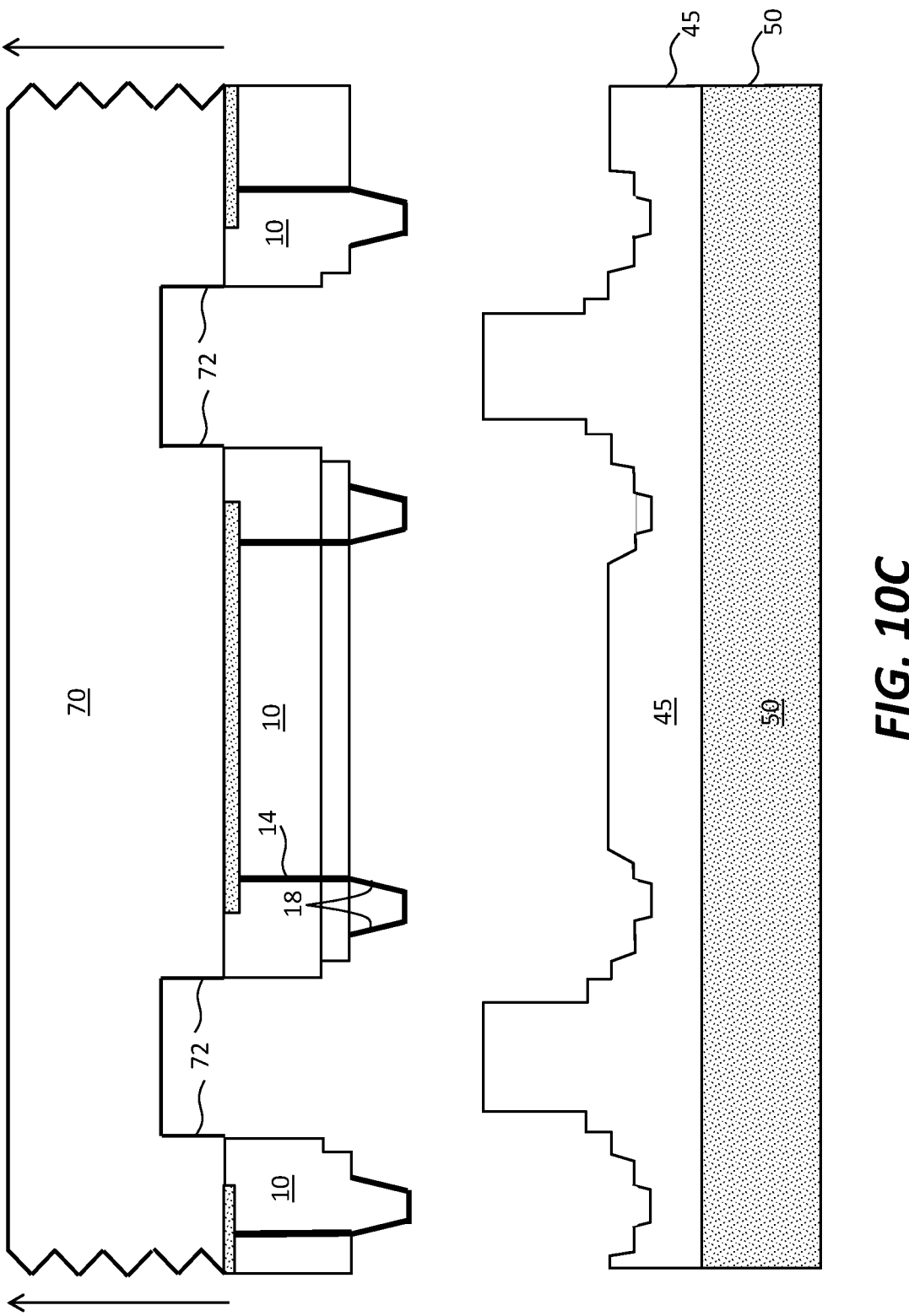

In some embodiments of the present disclosure and as illustrated in FIGS. 10A-10C, bonding layer 40 is also a weak-adhesion layer 30, e.g., a solid bonding-and-weak-adhesion layer 45, that bonds to both component 10 and carrier substrate 50. Bonding-and-weak-adhesion layer 45 has a relatively weak adhesion to component 10 (with or without a component bottom layer 18) that is weaker than an adhesion between stamp post 72 and component 10 and a stronger adhesion to carrier substrate 50 than to component 10, so that stamp 70 can remove (pick up) component 10 from bonding-and-weak-adhesion layer 45 without removing bonding-and-weak-adhesion layer 45 from carrier substrate 50. FIG. 10A illustrates printable-component structure 90 with release layer 20 sacrificial material in place, FIG. 10B illustrates printable-component structure 90 with release layer 20 etched to form a gap 20, and FIG. 10C illustrates stamp post 72 of stamp 70 adhered to component 10 removed from carrier substrate 50, leaving a hole in bonding-and-weak-adhesion layer 45. Bonding-and-weak-adhesion layer 45 can be deposited or coated as a solid or as a curable liquid, e.g., spray, spin, or curtain coated onto either carrier substrate 50 or onto component 10 and release layer 20, and then cured to a solid. Embodiments can comprise components 10 with posts 12 and component bottom layer 10, as shown in FIGS. 10A, 10B, with posts 12 and without component bottom layer 10, without posts 12 and with component bottom layer 10, or without posts 12 and without component bottom layer 10.

Thus, according to embodiments of the present disclosure, a printable component structure 90 can comprise a carrier substrate, a solid bonding-and-weak-adhesion layer 45 disposed on and adhered to carrier substrate 50, at least a portion of a component disposed directly on and in contact with at least a portion of the bonding-and-weak-adhesion layer 45, and release layer 20 disposed in contact with at least a portion of component 10. Bonding-and-weak-adhesion layer 45 has a (i) relatively weak adhesion to component 10 that is weaker than an adhesion between stamp post 72 (e.g., of an elastomeric and visco-elastic stamp) and component 10 and (ii) a relatively stronger adhesion to carrier substrate 50, so that stamp 70 can remove (pick up) component 10 from bonding-and-weak-adhesion layer 45 without removing bonding-and-weak-adhesion layer 45 from carrier substrate 50.

In some embodiments, component 10 comprises one or more posts 12 that are in contact with bonding-and-weak-adhesion layer 45, for example only posts 12 are in contact with bonding-and-weak-adhesion layer 45 to reduce the adhesion between component 10 (e.g., posts 12) and bonding-and-weak-adhesion layer 45. Posts 12 can extend through release layer 20 and release layer 20 can be disposed at least partially between at least a portion of component 10 and bonding-and-weak-adhesion layer 45, as shown in FIGS. 10A, 10B. In some embodiments, posts 12 penetrate or are embedded in bonding-and-weak-adhesion layer 45 to slightly increase the adhesion between component 10 and bonding-and-weak-adhesion layer 45. Posts can be electrically conductive posts (or comprise an electrically conductive coating, e.g., component bottom layer 18) electrically connected to a component circuit 11, for example through electrical via 14.

Figure 11:
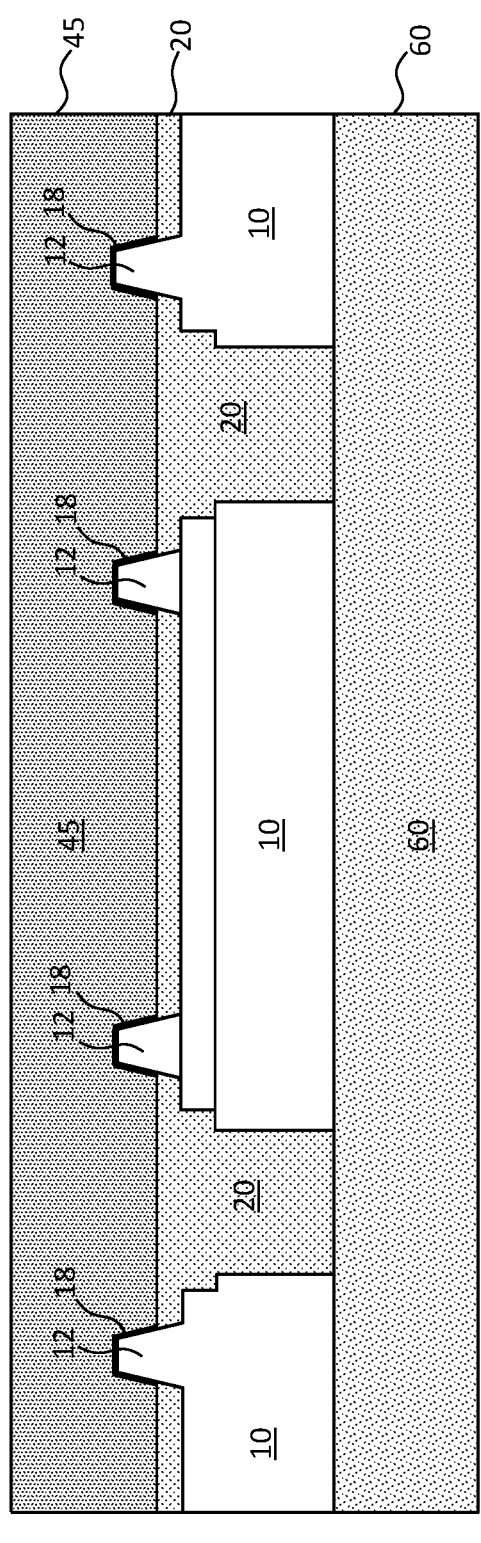
FIG. 11 is a cross section of a structure illustrating methods according to illustrative embodiments of the present disclosure.
Figure 12:
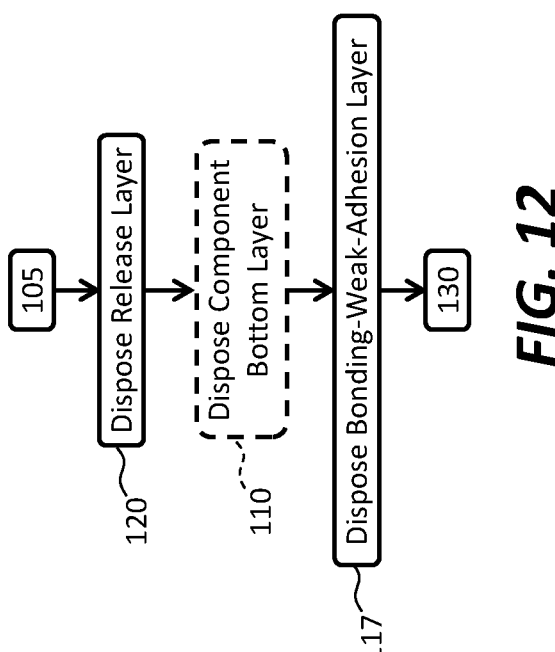
FIG. 12 is a flow chart illustrating methods according to illustrative embodiments of the present disclosure.

In methods of the present disclosure, printable component structure 90 comprising component 10 with one or more posts 12 can comprise coating bonding-and-weak-adhesion layer 45 as a single layer in step 117 over component 10 and release layer 20 on component source wafer 60 (e.g., as shown in FIGS. 11 and 12) where posts 12 protrude through release layer 20 and penetrate or are at least partially embedded in bonding-and-weak-adhesion layer 45. In some embodiments, bonding-and-weak-adhesion layer 45 is coated (e.g., by spray, curtain, or spin coating) on carrier substrate 50 and then bonded to release layer 20 and component 10 (or bonded only to component 10).

The use of posts 12 can provide several advantages. As noted, posts 12 can be electrically conductive and provide an electrical connection between structures on target substrate 80 (e.g., contact pads) and component circuit 11. Multiple posts 12, e.g., disposed around a perimeter of component 10 or at or near corners of component 10 (e.g., closer to a corner, edge, or perimeter of component 10 than to a center of component 10) can also provide mechanical stability when printing component 10. Posts 12 can also serve as a mechanical standoff between other portions of component 10 (e.g., the remainder of a bottom surface of component 10) and target substrate 80 so that particles (e.g., dirt or contamination present on target substrate 80 or on the remainder of a bottom surface of component 10) do not inhibit printing component 10 onto target substrate 80. The use of posts 12 can also render unnecessary other portions of component 10 that can protrude from component 10 toward a carrier substrate 50 or target substrate 80 that could inhibit printing component 10 onto target substrate 80. Such protruding portions of component 10 could be, in other prior-art methods, portions of a stabilization structure or post.

Methods of the present disclosure also provide process advantages. For example, the number of photolithographic patterning steps can be reduced by disposing release layer 20 as an unpatterned layer that extends over posts 12 in step 120 and then performing an unpatterned field etch to reduce the thickness of release layer 20 and expose the protruding posts 12. Weak-adhesion layer 30 (or bonding-and-weak-adhesion layer 45) can then be disposed as an unpatterned layer over release layer 20 and protruding posts 12 in step 115 (or 117). Thus, all of the layer coating steps subsequent to the construction of component 10 with posts 12 (with or without component bottom layer 18) can be done without any photolithographic patterning steps, reducing manufacturing costs.

Embodiments of the present disclosure provide a micro-transfer printable-component structure 90 with a printable component 10 and a physical connection to a carrier substrate 50 disposed beneath component 10. By locating the physical connection to carrier substrate 50 beneath component 10 instead of, for example, laterally adjacent to component 10, the area required for components 10 and physical connections to component source wafer 60 and carrier substrate 50 is reduced because no additional space for a tether or anchor structure is necessary. This enables a denser arrangement of components 10 on component source wafer 60, reducing costs of the source material (e.g., epitaxial material). The source material, e.g., compound semiconductor wafers or compound semiconductor epitaxial materials deposited on growth substrate 60 can be expensive. Thus, embodiments of the present disclosure provide reduced manufacturing costs. Moreover, the use of electrically conductive posts 12 can reduce interconnection costs between component 10 and devices or structures (e.g., wires or electrical contact pads) on target substrate 80. By providing a relatively small layer contact area 16L between component 10 and weak-adhesion layer 30 (e.g., with post(s) 12) compared to the relatively larger stamp contact area 16P, component 10 pick up and removal from carrier substrate 50 with stamp 70 is facilitated and enhanced.

Component 10 can be an active component, for example including one or more active elements such as electronic transistors or diodes. Alternatively, component 10 can be a passive component, for example including one or more passive elements such as resistors, capacitors, or conductors. In another embodiment, component 10 is a compound component 10 that includes both active and passive elements. Component 10 can be a semiconductor device such as an integrated circuit having one or more semiconductor layers, such as an epitaxial layer. Component 10 can be an unpackaged die. In yet another embodiment, component 10 is a compound element having a plurality of active or passive elements, such as multiple semiconductor devices with separate substrates, each with one or more active elements or passive elements, or both. In certain embodiments, the plurality of elements is disposed and interconnected on a compound element substrate separate from the substrates of any semiconductor devices or a different substrate. The compound element can be micro transfer printed itself after the elements have been arranged thereon. Components 10 can be electronic processors, controllers, drivers, light-emitting diodes, photodiodes, light-control devices, or light-management devices. Component 10 can be a micro-light emitting diode.

Components 10 made by methods of the present disclosure can include or be a variety of chiplets having semiconductor structures. Chiplets are small integrated circuits and can be unpackaged dies released from a source wafer and can be micro transfer printed. Chiplets can have at least one of a width, length, and height from 2 to 5 μm, 5 to 10 μm, 10 to 20 μm, or 20 to 50 μm. Chiplets can have a doped or undoped semiconductor substrate thickness of 2 to 5 μm, 5 to 10 μm, 10 to 20 μm, or 20 to 50 μm. The chiplets or components 10 can be micro-light-emitting diodes with a length greater than width, for example having an aspect ratio greater than or equal to 2, 4, 8, 10, 20, or 50.

In some embodiments of the present disclosure, components 10 are small integrated circuits. Such components 10 can be made in a source semiconductor wafer (e.g., a silicon or GaN wafer). Components 10 are formed using lithographic processes in an active layer on or in the process side of component source wafer 60, e.g., an epitaxial layer disposed on component source wafer 60.

Posts 12 can be electrical connections that extend generally perpendicular to the surface of carrier substrate 50. Such posts 12 can be formed from metals such as aluminum, titanium, tungsten, copper, silver, gold, or other conductive metals. The posts 12 can be formed by repeated masking and deposition processes that build up three-dimensional structures. Posts 12 can also be made by forming a layer on growth substrate 60 surface, etching a well (e.g., an inverted pyramidal structure) into the surface, filling or coating it with a conductive material such as metal, and then removing the layer. In some embodiments, posts 12 are made of one or more high elastic modulus metals, such as tungsten. As used herein, a high elastic modulus is an elastic modulus sufficient to maintain the function and structure of post 12 when pressed into a backplane contact pads on target substrate 80.

Posts 12 can have a variety of aspect ratios and typically have a peak distal area smaller than a base proximal area. Posts 12 can have a sharp point for embedding in or piercing backplane contact pads on target substrate 80. Components 10 with protruding posts 12 generally are discussed in U.S. Pat. Nos. 8,889,485 and 10,468,363, each of whose contents are incorporated by reference herein in their entirety.

According to various embodiments of the present disclosure, the native source wafer can be provided with components 10, release layer 20, weak-adhesion layer 30, bonding layer 40, carrier substrate 50, and posts 12 already formed, or they can be constructed as part of the process of the present disclosure.

In some embodiments, components 10 are small integrated circuits (or portions thereof) formed in a semiconductor wafer, for example gallium arsenide or silicon, which can have a crystalline structure. Processing technologies for these materials typically employ high heat and reactive chemicals. However, by employing transfer technologies that do not stress the component 10 or substrate materials, more benign environmental conditions can be used compared to thin-film manufacturing processes. Thus, embodiments of the present disclosure have an advantage in that flexible substrates, such as polymeric substrates, that are intolerant of extreme processing conditions (e.g., heat, chemical, or mechanical processes) can be employed for target substrates 80. Furthermore, it has been demonstrated that crystalline silicon substrates have strong mechanical properties and, in small sizes, can be relatively flexible and tolerant of mechanical stress. This is particularly true for substrates having 5-micron, 10-micron, 20-micron, 50-micron, or even 100-micron thicknesses.

Embodiments of the present disclosure provide advantages over other printing methods described in the prior art. By employing posts 12 on components 10 and a printing method that provides components 10 on a target substrate 80 with posts 12 adjacent to target substrate 80, a low-cost method for printing chiplets in large quantities over a target substrate 80 is provided. Furthermore, additional process steps for electrically connecting components 10 to target substrate 80 are obviated.

Embodiments have been described and illustrated with reference to a single component 10 as part of a printable-component structure. Those of ordinary skill in the art will understand that illustration and description of a single component 10 is made for simplicity's sake. It is contemplated that printable-component structures that include a plurality of such components 10 can be made, for example to enable massively parallel printing (e.g., micro-transfer printing) of such components 10. Such components 10 can be disposed in an array, for example a regular one- or two-dimensional array.

Printing of components 10 using stamps 70 has been described. In particular, the present disclosure contemplates advantages of using printable-component structures disclosed herein when printing components 10 therefrom with elastomeric stamps 70. However, printable-component structures are not limited to use with elastomeric stamps 70. For example, in some embodiments, a transfer device that is a vacuum-based or electrostatic transfer device can be used to print components 10. A stamp, a vacuum-based transfer device, or electrostatic transfer device can comprise a plurality of transfer posts, each transfer post being constructed and arranged to pick up a single component from a printable-component structure. According to some embodiments, micro-transfer printing can include any method of transferring components 10 (e.g., from a carrier wafer) to a destination substrate or surface. In various embodiments, components 10 can be adhered to stamp 70 by, for example, van der Waals forces, electrostatic forces, magnetic forces, chemical forces, adhesives, or any combination of these. In some embodiments, components 10 are adhered to a stamp with separation-rate-dependent adhesion, for example kinetic control of viscoelastic stamp materials such as can be found in elastomeric transfer devices such as a PDMS stamp 70.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The disclosure has been described in detail with particular reference to certain embodiments thereof, but it will be understood that variations and modifications can be effected within the spirit and scope of the claimed invention.

PARTS LIST

A cross section line
B cross section line
10 component
11 component circuit
12 post
14 electrical via
16L layer contact area
16P stamp contact area
18 component bottom layer/gold layer
20 release layer/sacrificial layer/gap
30 weak-adhesion layer
40 bonding layer
45 bonding-and-weak-adhesion layer

16

50 carrier substrate
60 growth wafer/component source wafer
70 stamp
72 stamp post
80 target substrate
82 adhesive layer
84 heat/radiation
90 printable-component structure
100 provide growth substrate step
105 form component step
110 optional dispose component bottom layer step
115 dispose weak-adhesion layer step
117 dispose bonding-and-weak-adhesion layer step
120 dispose release layer step
125 dispose bonding layer step
130 bond carrier substrate step
135 remove growth substrate step
140 remove release layer step
145 provide stamp step
150 contact stamp post to component step
155 remove component and stamp from carrier substrate step
160 provide target substrate and optional adhesive layer step
165 contact component to target substrate/adhesive layer with stamp step
170 remove stamp step
175 cure adhesive layer step
180 optional remove exposed adhesive step

The invention claimed is:

1. A printable-component structure, comprising:
a carrier substrate;
a bonding layer disposed on the carrier substrate;
a solid weak-adhesion layer disposed on the bonding layer;
a component disposed directly on and in contact with the weak-adhesion layer; and
a sacrificial release layer disposed in contact with the component.

2. The printable-component structure of claim 1, wherein the release layer is in direct contact with the bonding layer.

3. The printable-component structure of claim 1, wherein the release layer is in contact with the weak-adhesion layer.

4. The printable-component structure of claim 1, wherein the release layer is disposed between the component and the bonding layer.

5. The printable-component structure of claim 1, wherein the component comprises one or more posts that protrude from the component and are directly on and in contact with the weak-adhesion layer.

6. The printable-component structure of claim 5, wherein the post(s) extend through the release layer to the weak-adhesion layer.

7. The printable-component structure of claim 5, wherein each of the post(s) has a distal end and a proximal end, wherein the distal end has a smaller area than the proximal end.

8. The printable-component structure of claim 5, wherein (i) the post(s) comprise gold, (ii) the weak-adhesion layer comprises silicon dioxide, or (iii) both (i) and (ii).

9. The printable-component structure of claim 5, comprising a component circuit disposed in the component and wherein the post(s) are electrically conductive and electrically connected to the component circuit.

10. A printable-component structure, comprising:
a carrier substrate;

a solid bonding-and-weak-adhesion layer disposed on the carrier substrate;

a component disposed directly on and in contact with the bonding-and-weak-adhesion layer;

a stamp in contact with the component; and a sacrificial release layer disposed in contact with the component, wherein (i) the component is adhered more strongly to the stamp than to the solid bonding-and-weak-adhesion layer and (ii) the solid bonding-and-weak-adhesion layer is adhered more strongly to the carrier substrate than to the component.

11. The printable-component structure of claim 10, wherein the component comprises one or more posts that penetrate or are at least partially embedded in the solid bonding-and-weak-adhesion layer.

12. A printable-component structure, comprising:

a carrier substrate;

a solid bonding-and-weak-adhesion layer disposed on the carrier substrate;

a component disposed directly on and in contact with the solid bonding-and-weak-adhesion layer; and a sacrificial release layer disposed in contact with the component, wherein the component comprises one or more posts that penetrate or are at least partially embedded in the solid bonding-and-weak-adhesion layer.

13. The printable-component structure of claim 12, wherein only the one or more posts of the component penetrate or are at least partially embedded in the solid bonding-and-weak-adhesion layer.

14. A printable-component structure, comprising:

a carrier substrate;

a bonding layer disposed on the carrier substrate;

a solid weak-adhesion layer disposed on the bonding layer; and a component comprising one or more posts protruding from a first side of the component, wherein the one or more posts are disposed in contact with the weak-adhesion layer such that no other portion of the component is in contact with the weak-adhesion layer other than the one or more posts.

15. A printable-component structure, comprising:

a carrier substrate;

a bonding layer disposed on the carrier substrate;

a solid weak-adhesion layer disposed on the bonding layer;

a component disposed directly on and in contact with the weak-adhesion layer; and a release layer disposed in contact with the component, wherein the release layer is disposed between the component and the weak-adhesion layer.

16. A printable-component structure, comprising:

a carrier substrate;

a bonding layer disposed on the carrier substrate;

a solid weak-adhesion layer disposed on the bonding layer;

a component disposed directly on and in contact with the weak-adhesion layer; and a release layer disposed in contact with the component, wherein the component comprises one or more posts that protrude from the component and are directly on and in contact with the weak-adhesion layer, and wherein no portion of the component other than the one or more posts is disposed directly on and in contact with the weak-adhesion layer.

17. A printable-component structure, comprising:

a carrier substrate;

a bonding layer disposed on the carrier substrate;

a solid weak-adhesion layer disposed on the bonding layer;

a component disposed directly on and in contact with the weak-adhesion layer; and a release layer disposed in contact with the component, wherein a side of the component in contact with the weak-adhesion layer comprises a noble metal such that only the noble metal contacts the weak-adhesion layer.

18. The printable-component structure of claim 17, wherein the weak-adhesion layer comprises a dielectric such that the component contacts the weak-adhesion layer only by contact between the noble metal and the dielectric.

19. A printable-component structure, comprising:

a carrier substrate;

a solid bonding-and-weak-adhesion layer disposed on the carrier substrate;

a component disposed directly on and in contact with the solid bonding-and-weak-adhesion layer; and a release layer disposed in contact with the component, wherein the component comprises one or more posts that penetrate or are at least partially embedded in the solid bonding-and-weak-adhesion layer, wherein the release layer is disposed between a portion of the component and a portion of the solid bonding-and-weak-adhesion layer.

20. A printable-component structure, comprising:

a carrier substrate;

a bonding layer disposed on the carrier substrate;

a solid weak-adhesion layer disposed on the bonding layer; and a component comprising one or more posts protruding from a first side of the component, wherein the one or more posts are disposed in contact with the weak-adhesion layer such that no other portion of the component is in contact with the weak-adhesion layer other than the one or more posts, wherein the one or more posts comprise a noble metal such that only the noble metal contacts the weak-adhesion layer.

21. The printable-component structure of claim 20, wherein the weak-adhesion layer comprises a dielectric such that only the dielectric contacts the noble metal.

22. The printable-component structure of claim 21, wherein the one or more posts is two or more posts and a gap exists between a bottom side of the component and the weak-adhesion layer in a region bounded by the two or more posts.

* * * * *